United States Patent
Imamura et al.

(10) Patent No.: US 10,669,210 B2
(45) Date of Patent: Jun. 2, 2020

(54) SILICON NITRIDE SINTERED SUBSTRATE, SILICON NITRIDE SINTERED SUBSTRATE SHEET, CIRCUIT SUBSTRATE, AND PRODUCTION METHOD FOR SILICON NITRIDE SINTERED SUBSTRATE

(71) Applicant: HITACHI METALS, LTD., Minato-ku, Tokyo (JP)

(72) Inventors: Hisayuki Imamura, Tokyo (JP); Suguru Fujita, Tokyo (JP); Youichirou Kaga, Tokyo (JP); Hiroyuki Teshima, Tokyo (JP); Shigeyuki Hamayoshi, Tokyo (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 16/072,997

(22) PCT Filed: Mar. 24, 2017

(86) PCT No.: PCT/JP2017/012081
§ 371 (c)(1),
(2) Date: Jul. 26, 2018

(87) PCT Pub. No.: WO2017/170247
PCT Pub. Date: Oct. 5, 2017

(65) Prior Publication Data
US 2019/0031566 A1    Jan. 31, 2019

(30) Foreign Application Priority Data
Mar. 28, 2016 (JP) .................................. 2016-063667

(51) Int. Cl.
*C01B 21/068* (2006.01)
*C04B 35/587* (2006.01)
(Continued)

(52) U.S. Cl.
CPC .......... *C04B 35/587* (2013.01); *C01B 21/068* (2013.01); *C04B 35/64* (2013.01);
(Continued)

(58) Field of Classification Search
CPC ..... C01B 21/068; C04B 35/587; C04B 35/64; C04B 2235/77; H05K 1/03; H05K 1/0306
(Continued)

(56) References Cited

U.S. PATENT DOCUMENTS 5,928,768 A * 7/1999 Ikeda ....................... H01L 23/15
257/E21.53
9,938,444 B2 * 4/2018 Kusano ............... C04B 35/6303
(Continued)

FOREIGN PATENT DOCUMENTS

JP  01-174407  7/1989
JP  06-024850  2/1994
(Continued)

OTHER PUBLICATIONS

International Search Report for PCT/JP2017/012081 dated Jun. 13, 2017.

*Primary Examiner* — Timothy J Thompson
*Assistant Examiner* — Guillermo J Egoavil
(74) *Attorney, Agent, or Firm* — Nixon Peabody LLP; Jeffrey L. Costellia

(57) ABSTRACT

Provided is a large-sized silicon nitride sintered substrate and a method for producing the same. The silicon nitride sintered substrate has a main surface 101a of a shape larger than a square having a side of a length of 120 mm. A ratio dc/de of the density dc of the central area and the density de of the end area of the main surface 101a is 0.98 or higher. The void fraction vc of the central area of the main surface 101a is 1.80% or lower, and the void fraction ve of the end area is 1.00% or lower. It is preferred that the density dc of
(Continued)

the central area is 3.120 g/cm³ or higher, the density de of the end area is 3.160 g/cm³ or higher, and a ratio ve/vc of the void fraction vc of the central area and the void fraction ve of the end area is 0.50 or higher.

20 Claims, 9 Drawing Sheets

(51) Int. Cl.
    *C04B 35/64*     (2006.01)
    *H05K 1/03*     (2006.01)

(52) U.S. Cl.
    CPC .............. H05K 1/03 (2013.01); H05K 1/0306 (2013.01); *C04B 2235/77* (2013.01)

(58) Field of Classification Search
    USPC ........................................................ 174/258
    See application file for complete search history.

(56) References Cited

U.S. PATENT DOCUMENTS

| | | | | |
|---|---|---|---|---|
| 2002/0164475 | A1* | 11/2002 | Imamura | C01B 21/068 428/325 |
| 2005/0094381 | A1* | 5/2005 | Imamura | C01B 21/068 361/750 |
| 2007/0252523 | A1* | 11/2007 | Maeda | C04B 41/009 313/506 |
| 2009/0029128 | A1 | 1/2009 | Gotoh et al. | |
| 2009/0283307 | A1 | 11/2009 | Gotoh et al. | |
| 2011/0272187 | A1* | 11/2011 | Kaga | C04B 35/584 174/260 |
| 2014/0220302 | A1* | 8/2014 | Kaga | H05K 1/0306 428/149 |
| 2016/0362592 | A1 | 12/2016 | Kusano et al. | |
| 2017/0107109 | A1* | 4/2017 | Yamao | C01B 21/068 |

FOREIGN PATENT DOCUMENTS

| | | | | |
|---|---|---|---|---|
| JP | 2003-192445 | | 7/2003 | |
| JP | 3618422 | B2 | 2/2005 | |
| JP | 3797905 | | 7/2006 | |
| JP | 2011178598 | A * | 9/2011 | ............. C04B 35/64 |
| JP | 2011-216577 | A | 10/2011 | |
| JP | 5142198 | | 2/2013 | |
| JP | 5673106 | | 2/2015 | |
| JP | 5928896 | | 6/2016 | |
| JP | 2018020929 | A * | 2/2018 | ........... C04B 35/584 |
| JP | 6396817 | | 9/2018 | |
| KR | 10-2017-0003259 | | 9/2017 | |
| WO | WO-2007-004579 | | 1/2007 | |
| WO | WO-2013-146789 | | 10/2013 | |
| WO | WO-2015/152292 | A1 | 10/2015 | |

* cited by examiner (a)

(b)

(a)

(b)

(a)

(b)

SILICON NITRIDE SINTERED SUBSTRATE, SILICON NITRIDE SINTERED SUBSTRATE SHEET, CIRCUIT SUBSTRATE, AND PRODUCTION METHOD FOR SILICON NITRIDE SINTERED SUBSTRATE

TECHNICAL FIELD

The present application relates to a silicon nitride sintered substrate, a silicon nitride sintered substrate piece, a circuit board, and a method for producing the silicon nitride sintered substrate.

BACKGROUND ART

Recently, high power electronic circuits such as power modules, LEDs and the like have been used for various uses. An insulating substrate on which such a circuit is, for example, mountable is required. As such an insulating substrate, a ceramic substrate is generally used. Especially, a silicon nitride sintered substrate has a high mechanical strength. For example, Patent Document 1 discloses a silicon nitride sintered substrate having a low dielectric constant, a high air tightness and a high productivity.

CITATION LIST

Patent Literature

Patent Document No. 1: Japanese Laid-Open Patent Publication No. H6-24850

SUMMARY OF INVENTION

Technical Problem

For the above-described uses, a large-sized insulating substrate may be required. A large-sized silicon nitride sintered substrate is required such that a large number of electronic circuits are produced on one substrate to increase the productivity. The present invention provides a large-sized silicon nitride sintered substrate, silicon nitride sintered substrate piece, a circuit board and a method for producing the silicon nitride sintered substrate.

Solution to Problem

A silicon nitride sintered substrate in an embodiment of the present disclosure has a main surface of a shape larger than a square having a side of a length of 120 mm. A ratio dc/de is 0.98 or higher where a central area of the main surface has a density dc and an end area of the main surface has a density de, the central area of the main surface has a void fraction vc of 1.80% or lower, and the end area of the main surface has a void fraction ve of 1.00% or lower.

The density dc of the central area may be 3.120 $g/cm^3$ or higher, the density de of the end area may be 3.160 $g/cm^3$ or higher, and a ratio ve/vc of the void fraction vc of the central area and the void fraction ve of the end area may be 0.50 or higher.

The density dc of the central area may be 3.140 $g/cm^3$ or higher, the density de the end area may be 3.160 $g/cm^3$ or higher, and the void fraction vc of the central area may be 1.3% or lower.

The silicon nitride sintered substrate may have a partial discharge inception voltage, defined by a voltage value whey a discharge charge amount of 10 pC is reached, of 4.0 kV or higher.

The silicon nitride sintered substrate may have a partial discharge inception voltage, defined by a voltage value when a discharge charge amount of 10 pC is reached, of 5.0 kV or higher.

The silicon nitride sintered substrate may have a thickness of 0.15 mm or greater and 2.0 mm or less.

The main surface may have a square shape having a side of a length of 250 mm or a shape smaller than the square shape.

The silicon nitride sintered substrate may have a carbon content of 0.20% by mass or lower.

The main surface may have a shape larger than a rectangle of 150 mm×170 mm.

A plurality of silicon nitride sintered substrate piece in an embodiment of the present disclosure is divided from the silicon nitride sintered substrate described in any of the above.

A circuit board in an embodiment of the present disclosure includes the silicon nitride sintered substrate described in any of the above. The circuit board has a dielectric breakdown voltage of 8.0 kV or higher and Weibull coefficient of dielectric breakdown voltage of 6 or higher.

The main surface may have a square shape having a side of a length of 220 mm or a shape smaller than the square shape, and the circuit board has a Weibull coefficient of dielectric breakdown voltage of 10 or higher.

A method for producing a silicon nitride sintered substrate in an embodiment of the present disclosure includes step (a) of mixing $Si_3N_4$ powder at 80% by mass or higher and 98.3% by mass or lower, Mg compound powder at 0.7% by mass or higher and 10% by mass or lower as converted into an oxide, and at least one type of rare earth element compound powder at 1% by mass or higher and 10% by mass or lower as converted into an oxide to provide mixed powder; step (b) of putting the mixed powder into a slurry and forming a plurality of greensheets by molding; step (c) of stacking the plurality of greensheets with a boron nitride powder layer being located between each two adjacent greensheets, among the plurality greensheets, to form a stacked assembly; and step (d) of locating the stacked assembly in a sintering furnace and sintering the stacked assembly. In the step (c), the boron nitride powder layer has a thickness of 3 μm or greater and 20 μm or less. The step (d) includes step (d1) of removing carbon from the greensheets while maintaining an atmosphere temperature of 900° C. or higher and 1300° C. or lower in a vacuum atmosphere of 80 Pa or lower; and step (d2) of, after the step (d1), sintering the greensheets at an atmosphere temperature of 1600° C. or higher and 2000° C. or lower in a nitrogen atmosphere.

A method for producing a silicon nitride sintered substrate in another embodiment of the present disclosure includes step (a) of mixing Si powder, or Si powder and $Si_3N_4$ powder, at 80% by mass or higher and 98.3% by mass or lower as converted into $Si_3N_4$, Mg compound powder at 0.7% by mass or higher and 10% by mass or lower as converted into an oxide, and at least one type of rare earth element compound powder at 1% by mass or higher and 10% by mass or lower as converted into an oxide to provide mixed powder; step (b) putting the mixed powder into a slurry and forming a plurality of greensheets by molding; step (c) of stacking the plurality of greensheets with a boron nitride powder layer being located between each two adjacent greensheets, among the plurality of greensheets, to form a stacked assembly; and step (d) of locating the stacked assembly in a sintering furnace and sintering the stacked assembly. In the step (c), the boron nitride powder layer has a thickness 3 μm or greater and 20 μm or less. The step (d) includes step (d1) of removing carbon from the greensheets while maintaining an atmosphere temperature of 900° C. or higher and 1300° C. or lower in a vacuum atmosphere of 80 Pa of lower; step (d2) of, after the step (d1), nitriding the Si powder in the greensheets at an atmosphere temperature of 1350° C. or higher and 1450° C. or lower in a nitrogen atmosphere; and step (d3) of, after the step (d2), sintering the greensheets at an atmosphere temperature of 1600° C. or higher and 2000° C. or lower in the nitrogen atmosphere.

The silicon nitride sintered substrate has a main surface of a shape larger than a square having a side of a length of 120 mm. The main surface may have a shape larger than a rectangle of 150 mm×170 mm. The main surface may have a square shape having a side of a length of 250 mm or a shape smaller than the square shape.

Advantageous Effects of Invention

A silicon nitride sintered substrate and a method for producing the same according to the present application provide a large-sized silicon nitride sintered substrate having a high insulation reliability.

DESCRIPTION OF EMBODIMENTS

Figure 1:
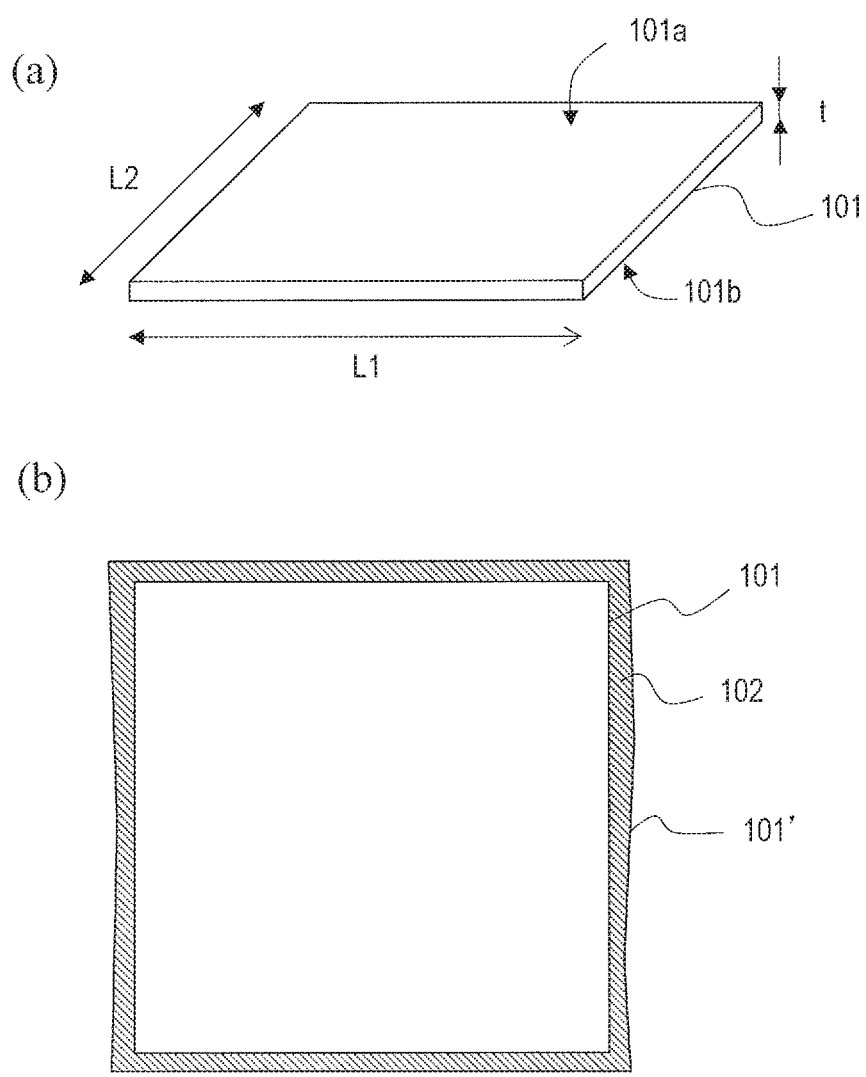
FIG. 1(a) is an perspective view showing an example of silicon nitride sintered substrate in an embodiment.
FIG. 1(b) shows the relationship between a silicon nitride sintered substrate and the silicon nitride sintered substrate shown in FIG. 1(a).

According to detailed studies made by the inventors of the present application, when the size of a silicon nitride sintered substrate is increased, various properties are made different between a central area and the vicinity thereof, and an end area, of the substrate; and as a result, the uniformity in each of the properties in the plane of the substrate is decreased. It has been found out that especially at the central area and the vicinity thereof of the substrate, a greensheet is not easily shrunk at the time of sintering, and therefore, the density is decreased and the void fraction is increased in the central area and the vicinity thereof.

In the case where silicon nitride sintered substrate is used as a substrate on which a high power circuit such as a power module, an LED or the like is, for example, to be mounted, it is preferred that the silicon nitride sintered substrate has a high breakdown voltage and a high insulation reliability. It has been found out as a result of the studies that a partial discharge voltage is usable as a characteristic by which it is evaluated whether or not a substrate has a high insulation reliability, and that the partial discharge voltage is correlated with a void fraction of a silicon nitride sintered substrate. The "high insulation reliability" refers to that high insulation characteristics are maintained for a long time.

It has also been found out that in order to produce a silicon nitride sintered substrate having a high in-plane uniformity in the density and the void fraction and having a large external shape, it is important to control the thickness of a boron nitride powder layer stacked together with greensheets during the production of the silicon nitride sintered substrate and to control the carbon content at the time of sintering. Based on these results of the studies, the inventors of the present application conceived a large-sized silicon nitride sintered substrate having a high breakdown voltage and a insulation reliability that are small in the in-plane variance, and a method for producing the same. Hereinafter, an example of silicon nitride sintered substrate and method for producing the same in this embodiment will be described. The present invention is not limited to any of the following embodiments and may be modified or altered in various manners.

(Silicon Nitride Sintered Substrate)

As shown in FIG. 1(a), a silicon nitride sintered substrate 101 in this embodiment has a main surface 101a. Herein, the term "main surface" refers to the broadest surface among surfaces of the silicon nitride sintered substrate 101. In this embodiment, a surface 101*b* opposite to the main surface 101*a* has substantially the same size as that of the main surface 101*a*. The main surface 101*a* has a shape larger than a square having a side of a length of at least 120 mm. In the case where the main surface 101*a* is rectangular, both of two sides L1 and L2 thereof are longer than 120 mm. For example, the silicon nitride sintered substrate 101 may have a shape larger than a rectangle having a size of 150 mm×170 mm. The main surface 101*a* may be polygonal or of a shape formed of a curved line with no apex or side such as, for example, a circle, an ellipse or the like. In the case of having a shape other than a square or a rectangle, the main surface 101*a* has a shape larger than a shape including (circumscribing) a square having a side of a length of 120 mm.

As shown in FIG. 1(*b*), the silicon nitride sintered substrate 101 is provided as follows: a greensheet is sintered to provide a silicon nitride sintered body 101', and an end portion 102 (represented by hatching), called an "extra portion", located along an outer perimeter is cut off from the silicon nitride sintered body 101'. The end portion 102 has a width of, for example, about 5 mm. In FIG. 1(*b*), the silicon nitride sintered substrate 101 provided after the end portion 102 is cut off is square. As described above, the silicon nitride sintered substrate 101 may be polygonal or of any other shape in accordance with the use thereof.

There is no limitation on the size of the main surface 101*a* as long as the density and the void fraction of the silicon nitride sintered substrate 101 fulfill conditions described below. However, as the main surface 101*a* is larger, the difference in the shrinking amount between the end area and the central area of the greensheet during the production of the silicon nitride sintered substrate 101 is larger. As a result, the breakdown voltage and the insulation reliability are more varied between the end area and the central area. In order to decrease the in-plane variance in the breakdown voltage and the insulation reliability, it is preferred that the main surface 101*a* has a square shape having a side of a length of 250 mm or a shape smaller than this square shape. It is more preferred that the main surface 101*a* has a square shape having a side of a length of 220 mm or a shape smaller than this square shape.

Thickness t of the silicon nitride sintered substrate 101 is preferably 0.15 mm or greater and 2.0 mm or less. If the thickness is less than 0.15 mm, the substrate may be cracked during the production of the silicon nitride sintered substrate 101, more specifically, in a step in which each of the silicon nitride sintered substrates 110 are peeled off from a post-sintering stacked assembly. This increases the possibility that the quality and the yield of the substrates are decreased. If the thickness greater than 2.0 mm, the difference in the density between the central area and the end area of the silicon nitride sintered substrate 101, and the difference in the density in the thickness direction of the substrate, are increased. As a result, the difference in the density bet seen the central area and the end area is made more conspicuous.

Regarding the main surface 101*a* of the silicon nitride sintered substrate 101, the ratio between density dc of the central area and density de of the end area, namely, dc/de is 0.98 or higher. If the density ratio dc/de is lower than 0.98, the density of the main surface 101*a* of the silicon nitride sintered substrate 101 is significantly varied, which is not preferable. Specifically, if the density ratio dc/de of the main surface 101*a* is lower than 0.98, the difference between the density dc of the central area and the density de of the end area is 0.06 g/cm$^3$ or greater. It is preferred that the density dc of the central area is 3.120 g/cm$^3$ or higher and that the density de of the end area is 3.160 g/cm$^3$ or higher. In the case where dc/de is 0.98 or higher, the density difference between the central area and the end area of the silicon nitride sintered substrate 101 is small, and thus the density uniformity in the silicon nitride sintered substrate 101 is increased. In the case where the density dc of the central area is 3.120 g/cm$^3$ or higher and the density de of the end area is 3.160 g/cm$^3$ or higher, the silicon nitride sintered substrate 101 has a high density and a high density uniformity. In the case where the density dc of the central area is 3.140 g/cm$^3$ or higher and the density de of the end area is 3.160 g/cm$^3$ or higher, the density of the silicon nitride sintered substrate 101 is higher and the uniformity thereof is higher. As a result, the silicon nitride sintered substrate 101 has high insulation characteristics. The density of the silicon nitride sintered substrate 101 is correlated with the void fraction described below, and is also related with insulation characteristics of the substrate.

According to the studies made by the inventors of the present application, the void fraction of the silicon nitride sintered substrate 101 is correlated with the carbon content. As the remaining amount of carbon is larger, the void fraction is higher. It is preferred that the carbon content of the silicon nitride sintered substrate 101 is 0.2% by mass or lower in the central area. If the carbon content exceeds 0.2% by mass, the void fraction of the central area exceeds 1.80%.

Patent Document No. 1 discloses that if carbon derived from an organic binder or the like remains in the greensheet during the production of a silicon nitride sintered substrate, silicon carbide is generated as a result of sintering, which causes a problem that the dielectric constant of the silicon nitride sintered substrate is increased or the insulation resistance thereof is decreased. In order to solve such a problem, Patent Document No. 1 discloses decreasing the carbon content of the silicon nitride sintered substrate to 1% by mass or lower.

As described above, according to the studies made by the inventors of the present application, it is preferred that the carbon content is significantly lower than the above-described value in order to decrease the void fraction of the silicon nitride sintered substrate 101. Patent Document No. 1 also describes a silicon nitride sintered substrate produced with no use of an organic binder. However, such a substrate has a size of 35 mm×35 mm×1.1 mm, and is not a large-sized substrate.

In order to produce a silicon nitride sintered substrate having a small amount of remaining carbon, it is conceivable forming a greensheet with no use of an organic binder. In this case, however, a large-sized greensheet cannot by formed by molding. Namely, in the case where no organic binder is used, it is highly difficult to produce a large-sized silicon nitride sintered substrate due to the issue of moldability.

The void fraction of the silicon nitride sintered substrate 101 is related with a partial discharge inception voltage. In the case of a large substrate, the difference in the shrinkage ratio between the end area and the central area of a greensheet is increased, which increases the void fraction and decreases the uniformity in the void fraction (specifically, increases the difference in the void fraction between the central area and the end area). As a result, the partial discharge voltage is decreased. For this reason, it is preferred that void fraction vc of the central area is 1.80% or lower and that void fraction ve of the end area is 1.00% or lower. It is more preferred that the void fraction vc of the central area is 1.3% or lower. If the void fraction vc of the central area and the void fraction ve of the end area are higher than these values, the partial discharge inception voltage, more specifically, the partial discharge inception voltage and a partial discharge extinction voltage are both decreased. In this case, the silicon nitride sintered substrate 101 does not have a sufficiently high insulation reliability. Specifically, in the case where a predetermined high voltage is applied, the time duration until dielectric breakdown is shortened. In order to guarantee a higher insulation reliability, it is preferred that the ratio between the void fraction vc of the central area and the void action ve of the end area, namely, ve/vc, is 0.50 or higher. In order to provide the above-described appropriate void fractions of the central area and the end area, the thickness of the boron nitride powder layer is made appropriate as described below, namely, is made 3 μm or greater and 20 μm or less.

Figure 2:
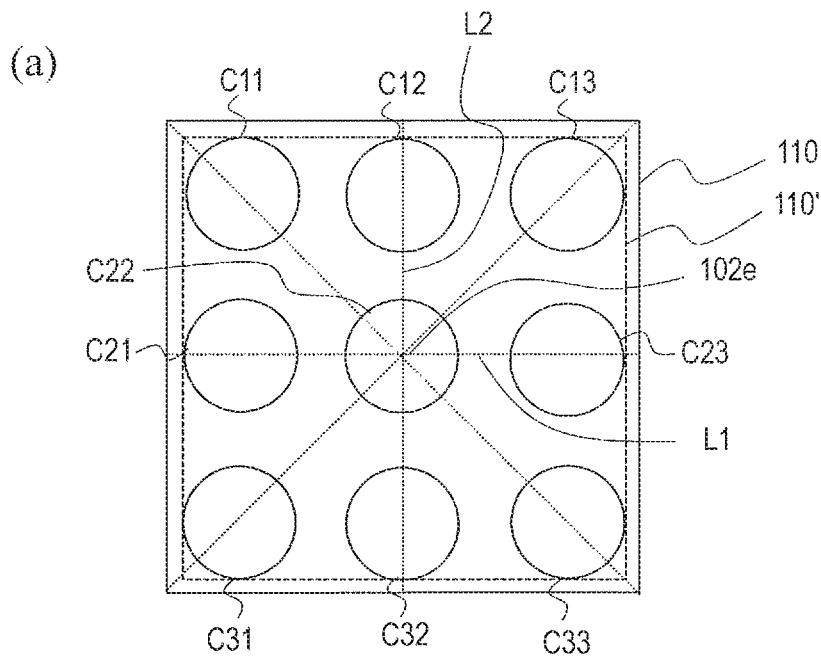
FIG. 2(a) and FIG. 2(b) are provided to explain the definition of a central area and an end area of the silicon nitride sintered substrate.
Figure 2:
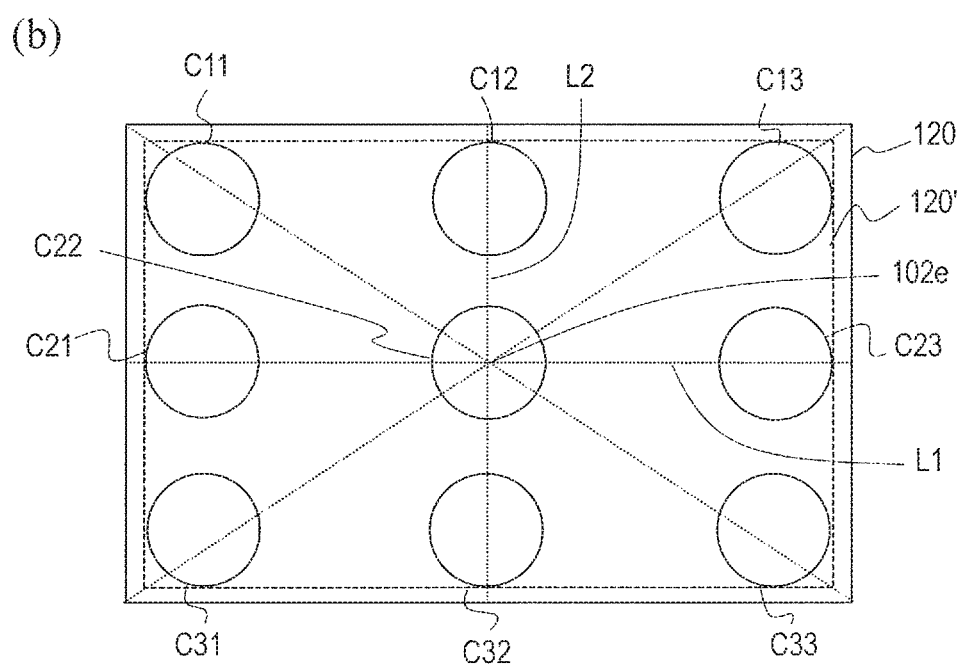

Now, the definitions of the above-described properties will be described. First, the size of the main surface 101a will be described. As described above, the main surface 101a has a shape larger than a square 110 having a side of a length of 120 mm (square drawn by phantom lines). In the case where the main surface 101a has a square shape, the external shape of the main surface 101a matches the square 110 drawn by the phantom lines The square 110 (square drawn by phantom lines) may be set as a maximum square inscribed in the shape of the main surface 101a. As shown in FIG. 2(a), the length of a side of the square 101 is defined by intervals L1 and L2, between two opposing sides, measured at the centers of the sides of the square.

In the square 110, nine circles C11 through C13, C21 through C23 and C31 through C33, each having a diameter of 3 cm, are arrayed in a matrix of 3 rows 3 columns. The circle C22 at the center is located such that the center of the square, namely, the intersection of two diagonal lines connecting two apexes located at diagonal positions, matches the center of the circle C22. The other eight circles C11 through C13, C21, C23, and C31 through C33 are located as follows. A square 110' formed of sides located inner to the sides of the square 110 by 1 cm is set. The circles C11, C13, C31 and C33 each having a diameter of 3 cm are located in contact with two of the sides of the square 110' in the vicinity of the apexes of the square 110'. The circles C12, C21, C23 and C32 are located at the middle between these circles and in contact with the corresponding sides the square 110'.

In the case where a rectangle (rectangle drawn by phantom lines) larger than the square 110 having a side of a length 120 mm (square drawn by phantom lines) may be inscribed in the main surface 101a of the silicon nitride sintered substrate 101, as shown in FIG. 2(b), a rectangle 120' is set and nine circles C11 through C13, C21 through C21 and C31 through C33 are located in substantially the same manner as described above.

The density and the void fraction are values found by cutting out the nine circles located under the above-described conditions by laser processing from the silicon nitride sintered substrate 101 and a measurement on the circles. The density of the central area is the density of the cut-out circle C22. The density of the end area is the minimum value among the values measured on the cut-out circles C11, C13, C13 and C33. The density is measured by the Archimedes' method.

The void fraction of the central area is the void fraction measured on the cut-out circle C22. The void fraction of the end area is the void fraction measured on the circle from which the density of the end area has been found by the above-described definition (circle having the minimum density value). In order to measure the void fraction, measurement samples are created as follows. A sample of 10 mm×10 mm is cut out by laser processing from each of the cut-out circle at the center and the cut-out circle at the end. A gap of each of the samples is filled with a resin, and the surface thereof is polished. In this manner, the measurement samples are created. The created samples are each imaged by a 500× optical microscope, and the area size of the voids present within an area of 300 μm×300 μm of the resultant image is found by image analysis. The void fraction is found by (area size of the void)/(300 μm×300 μm)×100. The observation of the central area and the vicinity thereof the substrate was made on a cross-section of the substrate.

The carbon content of the silicon nitride sintered substrate 101 is the value measured on the circle C22 at the center of the main surface. The carbon content is measured by a non-dispersive infrared absorption method. The carbon content may be measured by, for example, CS744-type carbon and sulfur analyzer produced by LECO Corporation.

The silicon nitride sintered substrate 101 has the above-described density and void fraction, and thus is high in the breakdown voltage and the insulation reliability and is high in the uniformity in the density and the void fraction of the main surface 101a. The partial discharge of the silicon nitride sintered substrate 101 is a precursor phenomenon for dielectric breakdown. As the partial discharge voltage is higher, the dielectric breakdown voltage is higher and the time duration until the dielectric breakdown is longer. The silicon nitride sintered substrate 101 in this embodiment has a partial discharge inception voltage of 4 kV or higher and a partial discharge extinction voltage of 4 kV or higher. Specifically, in the case where, regarding the silicon nitride sintered substrate 101, the density dc of the central area is 3.140 g/cm$^3$ or higher, the density de of the end area is 3.160 g/cm$^3$ or higher, and the void fraction vc of the central area is 1.3% or lower, the partial discharge inception voltage is 5 kV or higher. In this case, a higher insulation reliability is provided. The partial discharge inception voltage is defined by a voltage value when, while the voltage applied to the silicon nitride sintered substrate 101 is increased, a discharge amount of 10 pC is reached. The partial discharge extinction voltage is defined by a voltage value when, while the voltage applied to the silicon nitride sintered substrate 101 is decreased, the discharge amount of 10 pC is reached.

For example, the measurement may be performed by use of DAC-PD-3 produced by Soken Electric Co., Ltd. by setting the maximum applied voltage to 7 kV at a voltage increasing and decreasing rate of 100 V/sec. Any other device or any other measurement conditions may be used.

Figure 3:
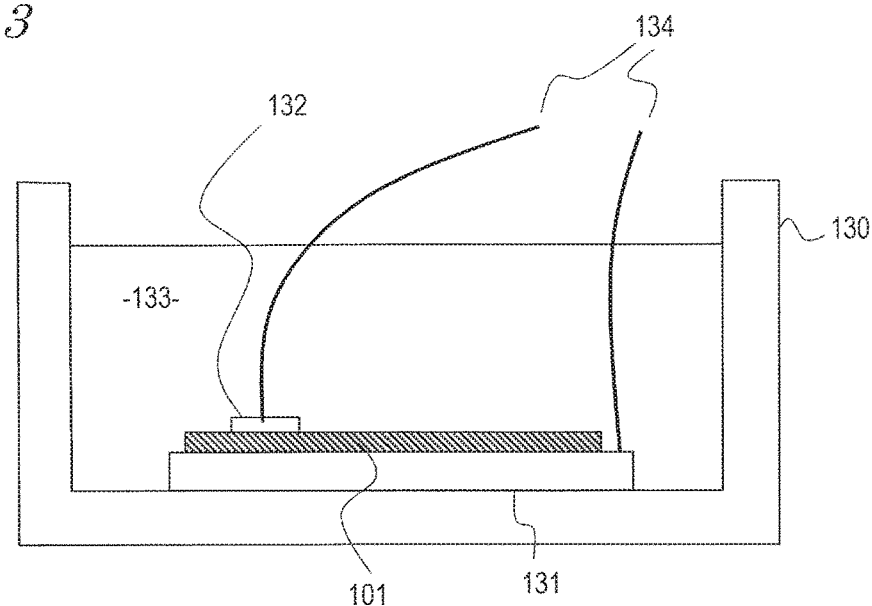
FIG. 3 is a schematic view showing a measurement system usable to measure a partial discharge voltage.

For the measurement, a measurement system shown in FIG. 3 is used. As shown in FIG. 3, a rear electrode 131 having a size of 240 mm×240 located in a tank 130, and the silicon nitride sintered substrate 101 as a measurement target is put thereon. A front electrode 132 having a diameter of 34 mm is located on the silicon nitride sintered substrate 101, and one ends of lines 134 are respectively connected with the rear electrode 131 and the front electrode 132. The other ends of the lines 134 are connected with the measurement device. The tank 130 is filled with a fluorine-based insulating liquid 133, and the measurement is performed.

Figure 4:
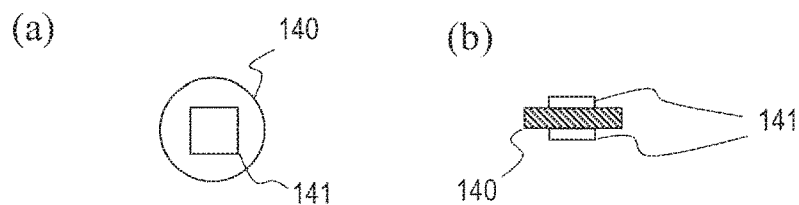
FIG. 4(a) and FIG. 4(b) are respectively a plan view and a cross-sectional view showing the shape of a test piece usable to find a breakdown voltage.

A circuit board produced to include the silicon nitride sintered substrate 101 in this embodiment has a dielectric breakdown voltage of 8 kV or higher and a Weibull coefficient of dielectric breakdown voltage of 6 or higher. The dielectric breakdown voltage is an average value found by a measurement performed on circular plates cut out from the central area and the end area, as defined above, of the main surface 101a of the silicon nitride sintered substrate 101. Specifically, as shown in FIG. 4(a) and FIG. 4(b), an Ag paste having a size of 10 mm×10 mm is applied to a front surface and a rear surface circular plate 140 cut out from the silicon nitride sintered substrate 101 and is baked at 500° C., and thus a measurement circuit board including electrodes 141 is produced. A DC voltage is applied between the electrodes 141 of the resultant measurement circuit board. The voltage at which dielectric breakdown occurs to the measurement circuit board, namely, at which a hole running through the substrate from the front surface to the rear surface is formed, is set as the dielectric breakdown voltage.

The circuit board in this embodiment includes the silicon nitride sintered substrate 101, a metal circuit plate (e.g., copper circuit plate) provided on one surface of the silicon nitride sintered substrate 101, and a metal heat sink plate (e.g., copper heat releasing plate) provided on the other surface of the silicon nitride sintered substrate 101. The circuit board may further include a semiconductor element or the like provided on a top surface of the metal circuit plate. The silicon nitride sintered substrate may be joined with the metal circuit plate and the metal heat releasing plate by, for example, an active metal method by use of brazing material or by a copper direct bonding method of directly joining the copper plate.

The Weibull coefficient of dielectric breakdown voltage is found by plotting a Weibull distribution in which the dielectric breakdown voltage is represented by the horizontal axis and the breakdown probability is represented by the vertical axis. Specifically, where the natural logarithm is Ln, the dielectric breakdown probability (probability density function) is F and the dielectric breakdown voltage is V (kV), Ln (Ln(1/(1−F))) is set as the vertical axis, and Ln(V) is set as the horizontal axis regarding a circular plate cut out from the circuit board. From measurement points plotted, the Weibull coefficient of dielectric breakdown voltage is found by an approximation equation represented by Ln(Ln(1/(1−F)))=mLn(V)+constant. In this equation, m is the Weibull coefficient of dielectric breakdown voltage.

There is no specific limitation on the dielectric constant of the silicon nitride sintered substrate 101, and the silicon nitride sintered substrate 101 may have any dielectric constant in accordance with the use thereof. For example, in the case where the silicon nitride sintered substrate 101 is used for a power module, it is preferred that the silicon nitride sintered substrate 101 has a dielectric constant of 10 or less, for example, about 7.9 or greater and about 8.1 or less.

The silicon nitride sintered substrate in this embodiment has, specifically, the density and the void fraction limited to the above-described ranges, and thus is large-sized and has a high breakdown voltage and a high insulation reliability that are highly uniform in the plane of the substrate. A silicon nitride sintered substrate that is large-sized and has superb characteristics for uses for a high power device, which is conventionally difficult to be produced, is now realized because of the above-described characteristics.

In the case where the silicon nitride sintered substrate in this embodiment is used as a substrate assembly to be divided, a large number of silicon nitride sintered substrate pieces are provided from one large-sized silicon nitride sintered substrate. Therefore, a high productivity is realized and the production cost of each silicon nitride sintered substrate piece is decreased. The large number of silicon nitride sintered substrate pieces provided as a result of the division are not much varied in the characteristics such as the density, the void fraction, the partial discharge voltage and the like. Two or more, namely, a plurality of silicon nitride sintered substrate pieces divided or cut out from one silicon nitride sintered substrate in this embodiment may be specified by, for example, reading identification information put on each of the silicon nitride sintered substrate pieces or measuring the continuity of change in the above-described properties of the substrate or the continuity of change in the composition or thickness thereof.

(Method for Producing the Silicon Nitride Sintered Substrate)

[1] Raw Material Powder

Material powder usable to produce the silicon nitride sintered substrate in this embodiment contains silicon nitride ($Si_3N_4$) as a main component and further includes a sintering additive. Specifically, the material powder contains $Si_3N_4$ powder at 80% by mass or higher and 98.3% by mass or lower, Mg compound powder at 0.7% by mass or higher and 10% by mass or lower as converted into an oxide, and at least one type of rare earth element compound powder at 1% by mass or higher and 10% by mass or lower as converted into an oxide. It is preferred that the ratio at which the silicon nitride powder is of the α-phase is 20% or higher and 100% or lower from the points of view of the density of the silicon nitride sintered body, the flexural strength and the thermal conductivity.

If the content of $Si_3N_4$ is lower than 80% by mass, the flexural strength and the thermal conductivity of the resultant silicon nitride sintered substrate are too low. By contrast, if the content of $Si_3N_4$ exceeds 98.3% by mass, the amount of the sintering additive is insufficient and thus the resultant silicon nitride sintered substrate is not dense. If the content of Mg is lower than 0.7% by mass as converted into an oxide, the amount of a liquid phase generated at a low temperature is insufficient. By contrast, if the content of Mg exceeds 10% by mass as converted into an oxide, Mg is volatilized too much and thus the silicon nitride sintered substrate tends to have pores. If the content of the rare earth element is lower than 1% by mass as converted into an oxide, the bonding of silicon nitride particles is too weak and thus cracks easily spread the boundary, which decreases the flexural strength. By contrast, if the content of the rare earth element exceeds 10% by mass as converted into an oxide, the ratio of the boundary phase is too high and thus the thermal conductivity is decreased.

The content of Mg (as converted into an oxide) is preferably 0.7% by mass or higher and 7% by mass or lower, more preferably 1% by mass or higher and 5% by mass or lower, and most preferably 2% by mass or higher and 5% by mass or lower. The content of the rare earth element (as converted into an oxide) is preferably 2% by mass or higher and 10% by mass or lower, and more preferably 2% by mass or higher and 5% by mass or lower. Therefore, the content of $Si_3N_4$ is preferably 83% by mass or higher and 97.3% by mass or lower, and more preferably 90% by mass or higher and 97% by mass or lower. Examples of the usable rare earth element include Y, La, Ce, Nd, Pm, Sm, Eu, Gd, Dy, Ho, Br, Tm, Yb, Lu and the like. Among these, Y is effective to increase the density of the silicon nitride sintered substrate and thus is preferred. Mg and the rare earth element may be in the form of an oxide or in the form of a compound other than oxygen. For example, a nitride such as $Mg_3N_2$, YN the like, or a silicide such as $Mg_2Si$ or the like, may be used. More preferably, Mg and the rare earth element are each used in the form of oxide powder. Therefore, a preferred sintering additive is a combination of MgO powder and $Y_2O_3$ powder.

Si powder may be used in the material powder to produce the silicon nitride sintered substrate in this embodiment. In this case, the Si powder may be nitrided before the green-sheet is sintered, so that the silicon nitride sintered substrate is provided. In the case where the Si powder is used as a material component, the content ratio (first content ratio) of the Si powder is the ratio as converted into $Si_3N_4$ in the case where the above-described silicon nitride powder is used. Specifically, the material powder contains the Si powder at 80% by mass or higher and 98.3% by mass or lower as converted into $Si_3N_4$, the Mg compound powder at 0.7% by mass or higher and 10% by mass or lower as converted into an oxide, and at least one type of rare earth element compound powder at 1% by mass or higher and 10% by mass or lower as converted into an oxide.

Alternatively, the Si powder and the $Si_3N_4$ powder may be used in the material powder to produce the silicon nitride sintered substrate in this embodiment. In the case where silicon nitride in the silicon nitride sintered substrate is entirety provided by the Si powder, there may be a possibility that Si is melted by rapid heat generation occurring at the time of nitridation thereof and is not sufficiently nitrided. By contrast, in the case where the $Si_3N_4$ powder is used as a material component, the amount of heat generation and the heat generation density are decreased, so that Si is suppressed from being melted. In this case, the Si powder and the $Si_3N_4$ powder may be mixed at any ratio. Specifically, the material powder contains the Si powder and the $Si_3N_4$ powder at 80% by mass or higher and 98.3% by mass or lower as converted into $Si_3N_4$, the Mg compound powder at 0.7% by mass or higher and 10% by mass or lower as converted into an oxide, and at least one type of rare earth element compound powder at 1% by mass or higher and 10% by mass or lower as converted into an oxide.

[2] Method for Producing the Silicon Nitride Sintered Substrate

A method for producing the silicon nitride sintered substrate by use of a stacked assembly of greensheets will be described below. Since the greensheets are stacked to form the stacked assembly and the stacked greensheets are sintered at the same time, the productivity is high. Herein, the "stacked assembly" to a temporary stack body used for sintering that includes a plurality of greensheets that are stacked so as not to be welded together. After the sintering, individual silicon nitride sintered substrates may be separated from the stacked assembly.

Figure 5A:
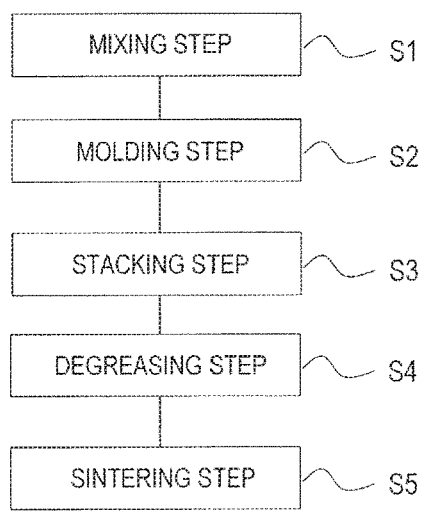
FIG. 5A is a flowchart showing an example of method for producing a silicon nitride sintered substrate in an embodiment.
Figure 5B:
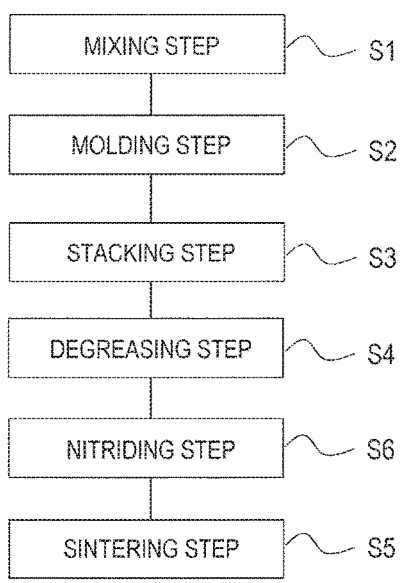
FIG. 5B is a flowchart showing another example of method for producing a silicon nitride sintered substrate in an embodiment.

FIG. 5A is a flowchart showing an example of method for producing the silicon nitride sintered substrate in this embodiment in the case where the silicon nitride powder is used for the material powder. FIG. 5B is a flowchart showing an example of method for producing the silicon nitride sintered substrate in this embodiment in the case where the silicon powder, or both of the silicon powder and the silicon nitride powder, are used for the material powder. For the sake of simplicity, the silicon nitride powder will be referred to as the $Si_3N_4$ powder, the silicon powder will be referred to as the Si powder, the Mg material will be referred to as the MgO powder, and the rare earth element material will be referred to as $Y_2O_3$ powder. The oxidization state or the nitridation state of the material components are not limited to any of these compositions, and any other oxidation state or nitridation state may be used.

(1) Mixing Step S1

The material powder formed as a result of mixing so as to have the above-described composition is mixed with a plasticizer (e.g., phthalic acid-based plasticizer), an organic binder (e.g., polyethylenebutyral) and an organic solvent (e.g., ethylalcohol) in a ball mill or the like to form a slurry containing the raw materials. It is preferred that the slurry has a solid content of 30% by mass or higher and 70% by mass or lower. In the case where the Si powder is to be nitrified as described above, the Si powder, or the Si powder and the $Si_3N_4$ powder, are used instead of the $Si_3N_4$ powder.

(2) Molding Step S2

After the slurry is defoamed and made viscous, the greensheet is formed by, for example, a doctor blade method. The thickness of the greensheet is appropriately set in consideration of the thickness of the silicon nitride sintered substrate to be formed and the shrinking ratio by sintering. The greensheet formed by the doctor blade method is usually lengthy strip-like, and thus is punched out or cut out into a predetermined shape and size. One greensheet has a shape larger than a square having a side of a length of 150 mm and has a size in consideration of the shrinking amount by sintering.

(3) Stacking Step S3

Figure 6:
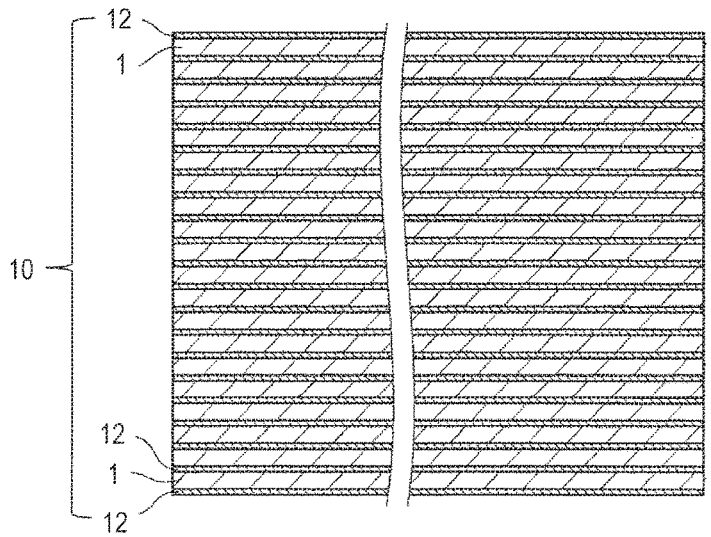
FIG. 6 is a cross-sectional view showing a stacked assembly including a plurality of greensheets.

In order to efficiently produce the silicon nitride sintered substrate 101, it is preferred to stack a plurality of the greensheets. As shown in FIG. 6, a plurality of the greensheets 1 are stacked with a boron nitride powder layer 12 having a thickness of 3 µm or greater and 20 µm or less being located between each two adjacent greensheets 1, among the plurality greensheets 1, to form a stacked assembly 10. The boron nitride powder layer 12 is provided in order to make it easy to separate the post-sintering silicon nitride sintered substrate, and may be formed by, for example, spraying, applying by a brush, or screen-printing a slurry of boron nitride powder on one surface of each of the greensheets 1. It is preferred that the boron nitride powder has a purity of 95% or higher and an average particle diameter of 1 µm or longer and 20 µm or shorter. Herein, the "average particle diameter" refers a value of D50 calculated from the particle diameter distribution measured by a laser diffraction-scattering method.

The boron nitride powder layer 12 is not sintered in a sintering step described below, and thus is not shrunk by the sintering. Therefore, if being thicker than 20 µm, the boron nitride powder layer 12 has a large influence of preventing the shrinkage of the greensheets. Since the shrinkage of the greensheet is prevented especially in the central area and the vicinity thereof, the resultant silicon nitride sintered substrate 101 tends to have the density decreased and the void fraction increased in the central area thereof. By contrast, if being thinner than 3 µm, the boron nitride powder layer 12 does not have a sufficient effect as a releasing agent, and as a result, it is made difficult to separate each of the silicon nitride sintered substrates from the stacked assembly after the sintering. It is more preferred that the boron nitride powder layer 12 has thickness of 5 µm or greater and 15 µm or less. The thickness of the boron nitride powder layer 12 may be adjusted by, for example, the average particle diameter of the boron nitride powder used and/or the viscosity of the slurry. The thickness of the boron nitride powder layer 12 is the thickness in the state of being applied to the greensheet as the slurry.

Figure 7:
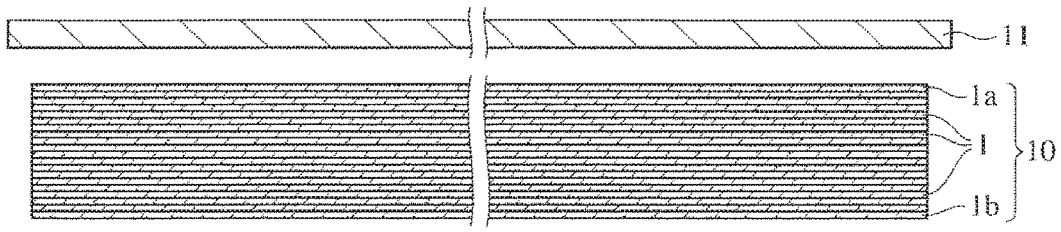
FIG. 7 is a cross-sectional view showing a state where a weight plate is placed on a top surface of the stacked assembly.

As shown in FIG. 7, in order to suppress the silicon nitride sintered substrate to be formed from being curved or waved, a weight plate 11 is placed on a top surface of the stacked assembly 10, so that a load acts on the greensheets 1. The load acting on each greensheet 1 is in the range of 10 to 600 Pa. If the load is more lightweight than 10 Pa, each of the post-sintering silicon nitride sintered substrates tends to be curved. By contrast, if the load exceeds 600 Pa, each greensheet 1 is restricted by the load and is inhibited from being smoothly shrunk. As a result, the resultant silicon nitride sintered substrate tends not to be dense. The load acting on each greensheet 1 is preferably 20 to 300 Pa, more preferably 20 to 200 Pa, and most preferably 30 to 150 Pa.

It is now assumed that the weight of the weight plate 11 is $W_1$ g, the weight and the area size of each greensheet 1 is $W_2$ g and S sm$^2$, and the number of the greensheets 1 in the stacked assembly 10 is n. In this case, the load acting on the uppermost greensheet 1a is 98×($W_1$/S)Pa, and the load acting on the lowermost greensheet 1b is 98×[($W_1$+$W_2$×(n−1)]/SPa. In the case where, for example, a boron nitride plate having a thickness of 2 mm is used as the weight plate 11 and the number of the greensheets 1 in the stacked assembly 10 is 20, the load acting on the lowermost greensheet 1b is about three to four times the load acting on the uppermost greensheet 1a. The weight of the weight plate 11 and the number of the greensheets 1 in the stacked assembly 10 are set in consideration of this point. It is preferred that the weight $W_1$ of the weight plate 11 is set such that even the lowermost greensheet 1b receives a load in the range of 10 to 600 Pa and is sintered without being curved or waved, with no restriction on the shrinkage thereof.

(4) Degreasing Step S4

The greensheets 1 contain an organic binder and a plasticizer. Therefore, before a sintering step S5, the stacked assembly 10 is heated to 400 to 800° C. to be degreased. The post-degreasing greensheets 1 are brittle. Therefore, it is preferred that the degreasing is performed on the stacked assembly 10.

(5) Sintering Step S5

(a) Sintering Container

Figure 8:
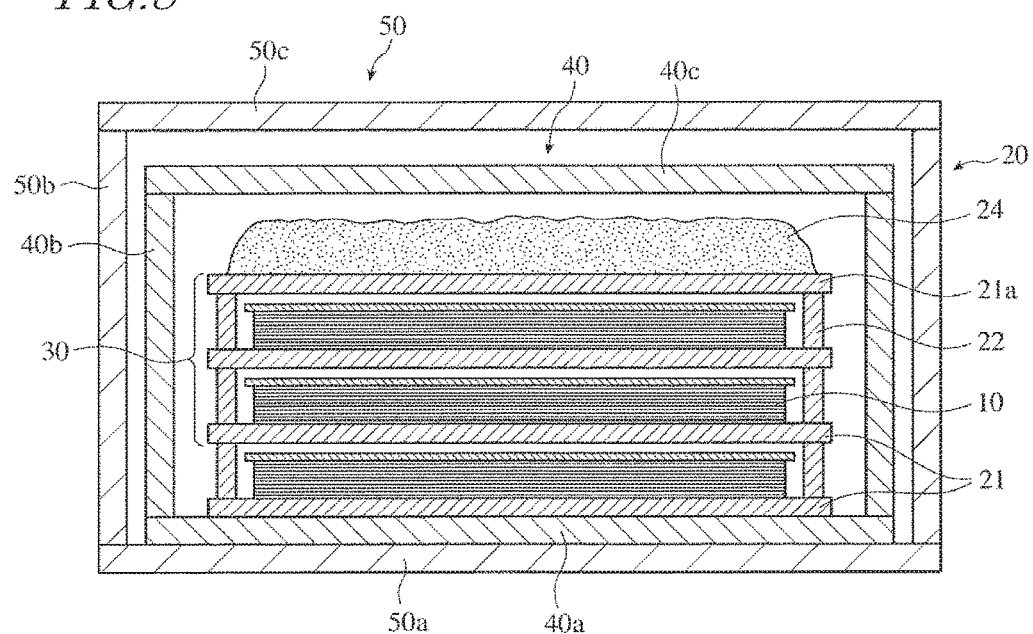
FIG. 8 is a cross-sectional view showing a state where stacked assemblies each having a weight plate placed thereon are located in a multi-stage frame in a double-wall container.

FIG. 8 shows an example of container usable to sinter a plurality of stacked assemblies 10 at the same time. The container 20 includes a carrying plate assembly 30 including a stack of plurality of carrying plates 21 provided in a multi-stage manner, each accommodating the stacked assembly 10, an inner container 40 accommodating the carrying plate assembly 30, and an outer container 50 accommodating the inner container 40. An interval between each two carrying plates 21 adjacent to each other in an up-down direction is maintained by a vertical frame member 22.

The container 20 include a double-wall structure of the inner container 40 and the outer container 50, so that decomposition of $Si_3N_4$ in the greensheets 1 and volatilization of MgO in the greensheets are suppressed and thus the silicon nitride sintered substrates are denser and less curved. It is preferred that the inner container 40 and the outer container 50 are both formed of boron nitride. Alternatively, the outer container 50 may be formed of carbon coated with p-boron nitride by CVD. In the case where the outer container 50 is formed of carbon coated with p-boron nitride, the following advantages are provided. Such a carbon substrate, which has a high thermal conductivity, easily uniformizes the temperature distribution during the temperature rise. The silicon nitride sintered substrates are suppressed from being curved or waved. Generation of a reducing atmosphere, which might be otherwise provided by the carbon substrate, is prevented by the p-boron nitride coating. The inner container 40 includes a bottom plate 40a, a side plate 40b and a top plate 40c. The outer container 50 includes a bottom plate 50a, a side plate 50b and a top plate 50c.

In the case where top surfaces of the carrying plates 21 have warpages or undulations, the lowermost greensheet 1b in contact with each carrying plate 21 has a contact portion in contact with the top surface of the carrying plate 21 and a non-contact portion not in contact with the top surface of the carrying plate 21. In this case, at the time of sintering, the non-contact portion of the greensheet 1b is easily shrunk, whereas the contact portion of the greensheet 1b is not easily shrunk. As a result, the shrinkage of the greensheet 1b is not uniform, and thus the greensheet 1b is curved or waved. The curve or wave of the lowermost greensheet 1b is transmitted to the upper greensheets 1, resulting in all the silicon nitride sintered substrates being curved or waved. For this reason, it is preferred that the top surface of each carrying plate 21 is as flat as possible. Specifically, it is preferred that the curve is within 2.0 μm/mm and that the wave is within 2.0 μm. The curve and wave of the carrying plate 21 may be measured by the same method as the curve and wave of the silicon nitride sintered substrate.

As shown in FIG. 8, it is preferred to locate packing powder 24 in the inner container 40. The packing powder 24 is, for example, mixed powder of 0.1 to 50% by mass of magnesia (MgO) powder, 25 to 99% by mass of silicon nitride ($Si_3N_4$) powder, and 0.1 to 70% by mass of boron nitride powder. The silicon nitride powder and the magnesia powder in the packing powder 24 are volatilized at a high temperature of 1400° C. or higher, adjust the partial pressure of Mg and Si in the sintering atmosphere, and suppress silicon nitride and magnesia (magnesium oxide) from being volatilized from the greensheets 1. The boron nitride powder in the packing powder 24 prevents the adhesion of the silicon nitride powder and the magnesia powder. Use of the packing powder 24 allows the silicon nitride sintered substrates to be dense and not to be much curved. In order allow the packing powder 24 to be handled easily and to prevent the packing powder 24 from contacting the greensheets 1, it is preferred to locate the packing powder 24 on the uppermost carrying plate 21a.

Figure 9:
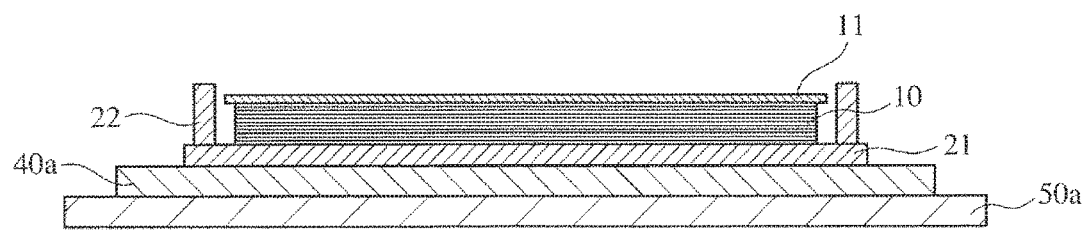
FIG. 9 is a cross-sectional view showing a state where one stacked assembly is located on bottom plates of an inner container and an outer container, with a carrying plate being located between the bottom plates and the stacked assembly.
Figure 10:
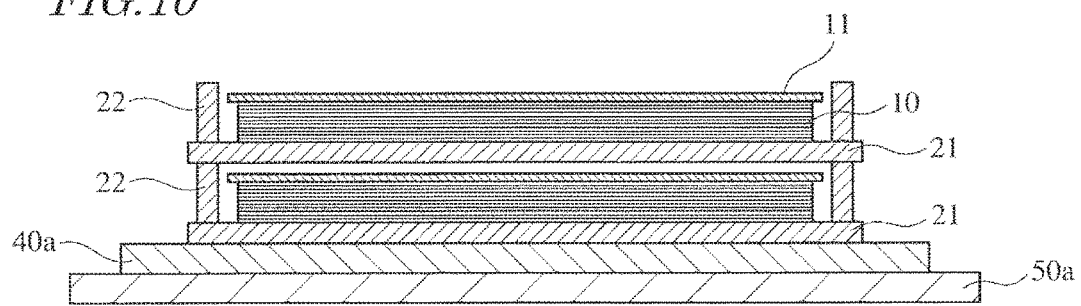
FIG. 10 is a cross-sectional view showing a state where another carrying plate is located on the carrying plate shown in FIG. 9 with a vertical frame member being located between the carrying plates, and a second stacked assembly is located on the another carrying plate.

As shown in FIG. 9, the bottom plate 40a of the inner container 40 is placed on a top surface of the bottom plate 50a of the outer container 50, the carrying plate 21 is placed on a top surface of the bottom plate 40a of the inner container 40, and the stacked assembly 10 including the plurality of greensheets 1 and the weight plate 11 are placed on the carrying plate 21. As shown in FIG. 10, the vertical frame member 22 is set on an outer circumference of the carrying plate 21, the next-stage carrying plate 21 is placed thereon, and the stacked assembly 10 and the weight plate 11 are placed thereon. In this manner, the carrying plate assembly 30 including desired number of the stacked assemblies 10 and weight plates 11 is formed. Then, the packing powder 24 is located on a top surface of the uppermost carrying plate 21a. Next, the side plate 40b and the top plate 40c of the inner container 40 are assembled, and the side plate 50b and the top plate 50c of the outer container 50 are assembled. In this manner, the container 20 accommodating the stacked assemblies 10 is completed. A desired number (e.g., five) such containers 20 are located in a sintering furnace (not shown).

(b) Temperature Profile and Sintering Atmosphere

Figure 11A:
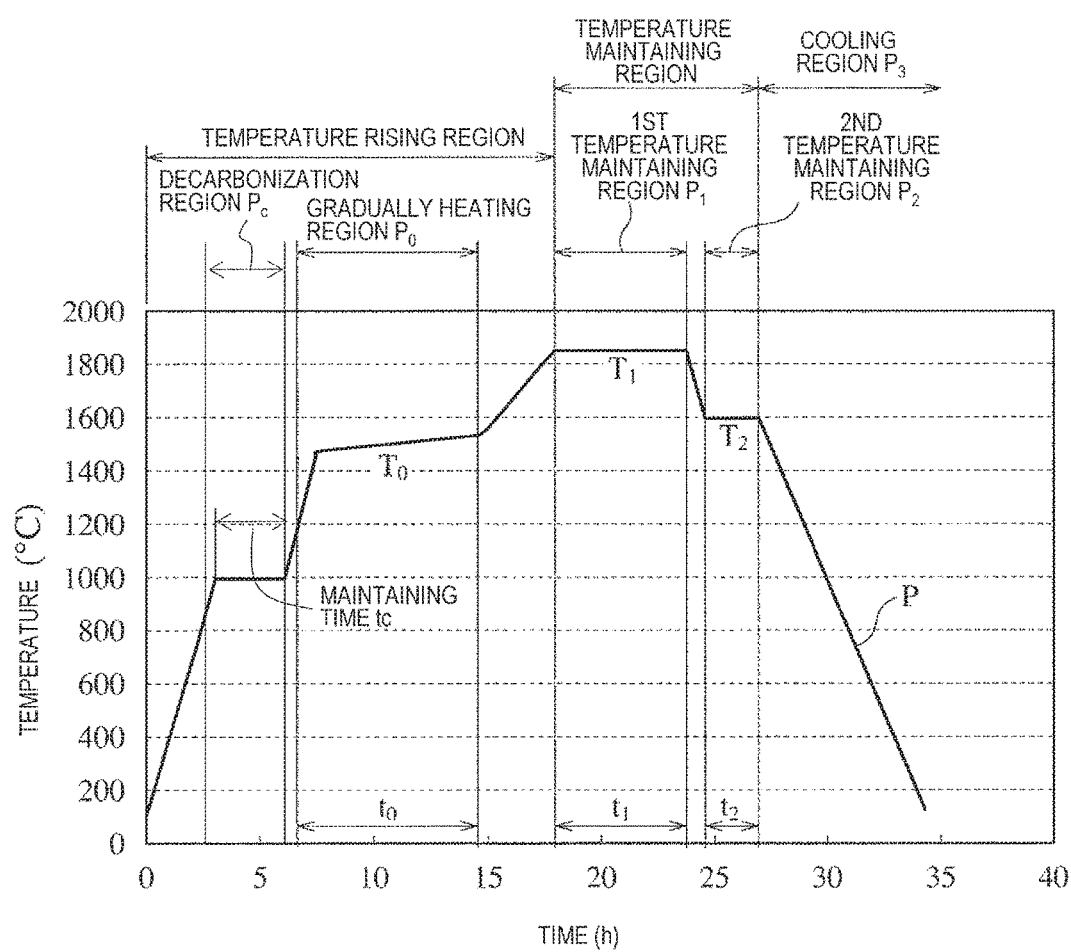
FIG. 11A is a graph showing an example of temperature profile in a sintering step in a method for producing the silicon nitride sintered substrate in an embodiment.

In the case where the $Si_3N_4$ powder is used, the greensheets 1 are sintered in accordance with a temperature profile P shown in FIG. 11A. In the case where the Si powder, or the Si powder and the $Si_3N_4$ powder, are used, the greensheets 1 are sintered in accordance with a temperature profile P' shown in FIG. 11B. The temperature profile P includes a temperature raising region including a decarbonization region Pc of removing carbon from the greensheets 1 and a gradually heating region $P_0$, a temperature maintaining region including a first temperature maintaining region $P_1$ and a second temperature maintaining region $P_2$, and a cooling region. In FIG. 11A, the temperature represented by the vertical axis is the atmosphere temperature in the sintering furnace. Namely, the sintering step includes a decarbonization step of using the decarbonization region Pc of the temperature profile P and a sintering step of using the first temperature maintaining region $P_1$ of the temperature profile P. In the case where the Si powder, or the Si powder and the $Si_3N_4$ powder, are used, a nitridation step is included between the decarbonization step and the sintering step. Therefore, the temperature profile P' includes a nitridation region Pn between the decarbonization region Pc and the first temperature maintaining region $P_1$.

The atmosphere temperature in the sintering furnace in the sintering step may be, for example, a temperature of a target (carbon) in the furnace measured through a window provided in the sintering furnace by an infrared thermometer. Specifically, the container for sintering that accommodates the greensheets, a carbon cylindrical wall having the container for sintering in an area inner thereto, and the target located in the vicinity of an outer circumference of the cylindrical wall may be provided in the sintering furnace. The measurement of the temperature of the target may be substantially considered as the measurement of a temperature corresponding to the atmosphere temperature in the furnace in the temperature raising region or the temperature maintaining region.

(c) Decarbonization Region Pc

First, the atmosphere temperature in the sintering furnace is raised from room temperature to a temperature range of the decarbonization region Pc. The heating rate is, for example, 60° C./hr. When the atmosphere temperature in the sintering furnace reaches a temperature of 900° C. or higher and 1300° C. or lower, the temperature is maintained in this temperature range for 30 minute or longer and 2 hours or shorter (maintaining time $t_c$). It is preferred that the pressure in sintering furnace is a reduced pressure, specifically, 80 Pa or lower. As described above, if carbon remains at the time of sintering, voids are easily generated in the sintered body. Therefore, the greensheets 1 are maintained at the reduced pressure to remove carbon from the greensheets 1. This step is the decarbonization step of removing carbon more completely by use of a condition under which carbon is more easily volatilized than in the degreasing step S4. If the atmosphere temperature is lower than 900° C., carbon may not be removed sufficiently. If the atmosphere temperature is higher than 1300° C., the sintering additive may also be removed. It is more preferred that the atmosphere temperature in the sintering furnace is 1000° C. or higher and 1250° C. or lower.

In general, in the production of a silicon nitride sintered substrate, the sintering is performed in a nitrogen atmosphere in order suppress volatilization of nitrogen. However, it has been found by the studies made by the inventors of the present application that the greensheets 1 may be heated at a temperature and in an atmosphere where nitrogen is not volatilized, so that carbon is removed more completely to suppress generation of voids while the volatilization of nitrogen is suppressed.

(d) Gradually Heating Region

After the heating by use of the decarbonization region Pc is finished, the atmosphere temperature in the sintering furnace is controlled by the temperature profile in the gradually heating region $P_0$. The gradually heating region $P_0$ is a temperature region in which the sintering additive contained in the greensheets 1 reacts with an oxide layer at a surface of the silicon nitride particles to generate a liquid phase. In the gradually heating region $P_0$, the silicon nitride particles are suppressed from growing, and are re-aligned and densified in the sintering additive in the form of the liquid phase. As a result, the silicon nitride sintered substrate provided after the first and second temperature maintaining regions $P_1$ and $P_2$ has a short pore diameter, a low porosity, a high flexural strength and a high thermal conductivity. It is preferred that temperature $T_0$ in the gradually heating region $P_0$ is in the range of 1400° C. or higher and 1600° C. or lower, which is lower than temperature $T_1$ in the first temperature maintaining region $P_1$, that the heating rate in the gradually heating region $P_0$ is 300° C./hr or higher, and that heating time $t_0$ in the gradually heating region $P_0$ is 0.5 hours or longer and 30 hours shorter. The heating rate may include 0° C./hr; namely, the gradually heating region $P_0$ may be a temperature maintaining region in which the temperature is maintained at a certain level. The heating rate in the gradually heating region $P_0$ is more preferably 1 to 150° C./hr, and most preferably 1 to 100° C./hr. The heating time $t_0$ is more preferably 1 to 25 hours, and most preferably 5 to 20 hours.

It is preferred that in the gradually heating region and steps thereafter, the sintering furnace is filled with a nitrogen atmosphere. Specifically, nitrogen, a mixed gas containing nitrogen as a main component and also containing inert gas such as argon or the like, or a mixed gas containing nitrogen gas and about 3% or less of hydrogen is usable. It is preferred that the pressure in the sintering furnace is 1 atmospheric pressure or higher and about 20 atmospheric pressure or lower.

Figure 11B:
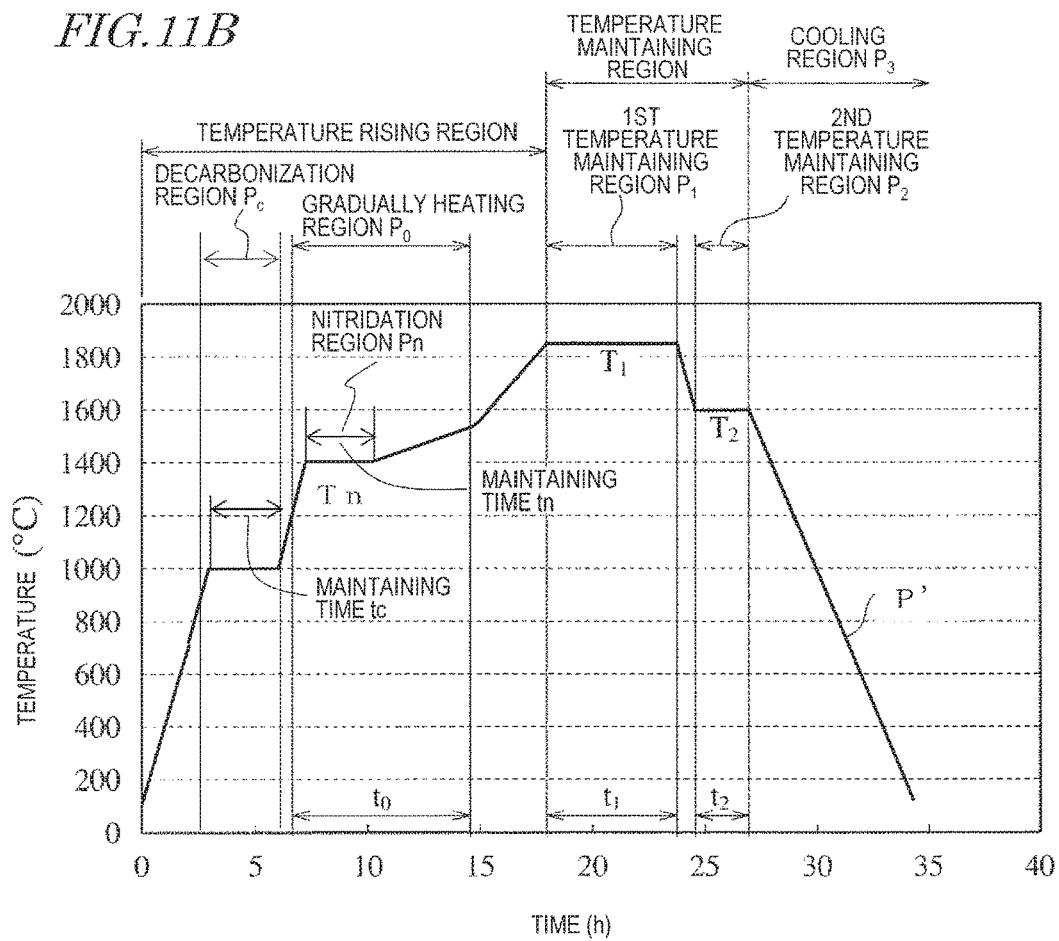
FIG. 11B is a graph showing another example of temperature profile in a sintering step in a method for producing the silicon nitride sintered substrate in an embodiment.

In the case where the Si powder, or the Si powder and the $Si_3N_4$ powder, are used, as shown in FIG. 11B, the nitridation region Pn is provided in the gradually heating region $P_0$, so that a nitridation step is performed to nitride the Si powder. For example, after the heating by use of the decarbonization region Pc is finished, the atmosphere temperature in the sintering furnace is raised and is maintained at temperature Tn in the range of 1350° C. or higher and 1450° C. or lower. It is preferred that maintaining time tn is 3 hours or longer and 15 hours or shorter. The greensheets 1 are maintained at this temperature in the nitrogen atmosphere, so that the Si powder reacts with nitrogen, which is the atmosphere in the sintering furnace, to generate silicon nitride.

(e) First Temperature Maintaining Region

After the heating by use of the gradually heating region $P_0$ is finished, the atmosphere temperature in the sintering furnace is controlled by the temperature profile in the first temperature maintaining region $P_1$. In this step, the material components in the greensheets 1 are sintered.

The first temperature maintaining region $P_1$ is a temperature region in which the liquid phase generated in the gradually heating region $P_0$ is used to promote the re-alignment of the silicon nitride particles, phase transformation from α-phase silicon nitride crystal into β-phase silicon nitride crystal, and particle growth of the silicon nitride crystal, and thus to further densify the sintered body. As can be seen, the α to β phase transformation is one cause to promote the densification of the sintered body. Therefore, it is preferred that the silicon nitride powder as a material component contains the α-type crystal, and that the ratio at which the silicon nitride powder is of the α-type is 20% or higher and 100% or lower. In consideration of the size and the aspect ratio (ratio between a longer axis and a shorter axis) of the β-type silicon nitride particles, formation of pores by the volatilization of the sintering additive, and the like, it is preferred that the temperature $T_1$ in the first temperature maintaining region $P_1$ is in the range of 1600° C. or higher and 2000° C. or lower and that maintaining time $t_1$ is about 1 hour to 30 hours. More preferably, the temperature $T_1$ is in the range of 1800° C. or higher and 2000° C. or lower. If the temperature $T_1$ in the first temperature maintaining region $P_1$ is lower than 1600° C., it is difficult to sufficiently densify the silicon nitride sintered body. By contrast, if the temperature $T_1$ exceeds 2000° C., the sintering additive is volatilized too much and silicon nitride is decomposed too much, and as a result, it is difficult to sufficiently densify the silicon nitride sintered body. The heating temperature $T_1$ in the first temperature maintaining region $P_1$ may be changed (e.g., gradually raised) within the range of 1600° C. to 2000° C.

The temperature $T_1$ in the first temperature maintaining region $P_1$ is more preferably in the range of 1750° C. or higher and 1950° C. or lower, and most preferably in the range of 1800° C. or higher and 1900° C. or lower. The temperature $T_1$ in the first temperature maintaining region $P_1$ is preferably higher by 50° C. or more, more preferably higher by 100° C. or more and 300° C. or less, than the upper limit of the temperature $T_0$ in the gradually heating region $P_0$. The maintaining time $t_1$ is 2 hours or longer and 20 hours or shorter, and most preferably 3 hours or longer and 10 hours or shorter.

(f) Second Temperature Maintaining Region

The second temperature maintaining region $P_2$ after the first temperature maintaining region $P_1$ is a temperature region in which the sintered body is maintained at temperature $T_2$ slightly lower than the temperature $T_1$ in the first temperature maintaining region $P_1$ to maintain the liquid phase treated in the first temperature maintaining region $P_1$ as it is or in a state where the solid phase and the liquid phase coexist. It is preferred that the temperature region $T_2$ in the second temperature maintaining region $P_2$ is in the range of 1400° C. to 1700° C. and is lower than the temperature $T_1$ in the first temperature maintaining region $P_1$. Maintaining time $t_2$ in the second temperature maintaining region $P_2$ is 0.5 to 10 hours. The second temperature maintaining region $P_2$ is provided after the first temperature maintaining region $P_1$, so that, for example, the curve of the silicon nitride sintered substrate may be within 3.2 μm/mm.

After the heating by use of the first temperature maintaining region $P_1$ is finished, the atmosphere temperature in the sintering furnace is controlled by the temperature profile in the second temperature maintaining region $P_2$. If the temperature $T_2$ in the second temperature maintaining region $P_2$ is lower than 1400° C., the boundary phase is easily crystallized and thus the flexural strength of the resultant silicon nitride sintered substrate is low. By contrast, if the temperature $T_2$ exceeds 1700° C., the liquid phase has too high a fluidity and thus the above-described effect is not provided. The temperature $T_2$ is more preferably 1500° C. or higher and 1650° C. or lower, and most preferably 1550° C. or higher and 1650° C. or lower. It is preferred that the maintaining time $t_2$ in the second temperature maintaining region $P_2$ is 1 hour or longer and 5 hours or shorter. If the maintaining time $t_2$ in the second temperature maintaining region $P_2$ is shorter than 0.5 hours, the boundary phase is not sufficiently uniformized. In order to suppress the volatilization of the sintering additive to prevent the mechanical characteristics and the thermal conductivity of the silicon nitride sintered substrate being lowered, the maintaining time $t_2$ in the second temperature maintaining region $P_2$ is set to 10 hours or shorter.

Use of the above-described conditions allows the Mg to be distributed uniformly in the boundary phase in the thickness direction of the silicon nitride sintered substrate without being eccentrically distributed. Therefore, the silicon nitride sintered substrate has a high mechanical strength (flexural strength and fracture toughness) and is suppressed from being curved.

(g) Cooling Region

After the temperature control by use of the second temperature maintaining region $P_2$ is finished, the atmosphere temperature in the sintering furnace is controlled by the temperature profile in the cooling region $P_3$. The cooling region $P_3$ is a temperature region in which the liquid phase maintained in the second temperature maintaining region $P_2$ is cooled and solidified to secure the position of the resultant boundary phase. In order to solidify the liquid phase quickly to maintain the uniformity in the distribution of the boundary phase, the cooling rate in the cooling region $P_3$ is preferably 100° C./hr or higher, more preferably 300° C./hr or higher, and most preferably 500° C./hr or higher. Practically, it is preferred that the cooling rate is 500° C./hr or higher and 600° C./hr or lower. The liquid phase is cooled at such a cooling rate, so that the crystallization of the sintering additive to be solidified is suppressed and thus the resultant grain boundary phase is mainly formed of a glassy phase. Therefore, the flexural strength of the silicon nitride sintered substrate is increased. The cooling rate in the cooling region $P_3$ maintained until the temperature is lowered to 1200° C., and there is no specific limitation on the cooling rate at which the temperature is decreased to a lower temperature.

(h) Cutting of the Extra Portion

As a result of the above-described steps, the silicon nitride sintered bodies 101' are produced. In the stacked assemblies 10, the silicon nitride sintered bodies 101' are separated from each other by the boron nitride powder layer 12. Therefore, each silicon nitride sintered body 101' is easily separated from the cooled stacked assemblies 10. As described above with reference to FIG. 1(b), the end portion 102 located along the outer perimeter is cut off from the separated silicon nitride sintered body 101'. As a result, the silicon nitride sintered substrate 101 is provided.

According to the method for producing the silicon nitride sintered substrate in this embodiment, the thickness of the boron nitride powder layer located between the greensheets 1 while the greensheets 1 are stacked is selected to be an appropriate range, so that the greensheets are suppressed from being restricted by the boron nitride powder layer during the sintering. Thus, in the central area, the density is suppressed from being decreased and the void fraction suppressed from being increased. While the atmosphere temperature is rising during the sintering, carbon is removed at a reduced pressure, so that the amount of carbon remaining in the greensheets is decreased. This suppresses the generation of the voids during the sintering. Therefore, the resultant silicon nitride sintered substrate has a high in-plane uniformity in the density and of the void fraction and has a large external size.

EXAMPLES

Silicon nitride sintered substrates were produced under various conditions and characteristics thereof were examined. Hereinafter, the results will be described.

1. Production of the Silicon Nitride Sintered Substrates

Examples 1 Through 28

A greensheet 1 was formed, by a doctor blade method, of a material powder slurry (solid content concentration: 60% by mass) containing 3.0% by mass MgO powder, 2.0% by mass of $Y_2O_3$ powder and a remaining part of $Si_3N_4$ powder and unavoidable impurities. Twenty such greensheets 1 were stacked with a boron nitride powder layer being located between each two adjacent greensheets 1 to form a stacked assembly 10. The size of the greensheets 1 was varied by example as shown in Table 1. The thickness of the boron nitride powder layer was varied by example as shown in Table 1.

Weight plates 11 were respectively located on such stacked assemblies 10, and the resultant assemblies including the weight plates 11 and the stacked assemblies 10 were respectively located on carrying plates 21. The resultant assemblies including the weight plates 11, the stacked assemblies 10 and the carrying plates 21 were set in a container 20 (double-wall container) shown in FIG. 8. The load on the uppermost greensheet 1*a* provided by the weight plate 11 was 40 Pa. A packing powder containing 15% by mass of magnesia powder, 55% by mass of silicon nitride powder and 30% by mass of boron nitride powder was located on a top surface of the uppermost carrying plate 21*a*.

The container 20 was put into a sintering furnace, and the pressure of the sintering furnace was decreased to $10^{-1}$ Pa by use of a vacuum pump. As shown in Table 1, the maintaining temperature in the decarbonization region Pc was varied by example. The maintaining time $t_c$ in each example was set to 1 hour.

Then, the atmosphere in the sintering furnace was changed to, for example, nitrogen of 7 atmospheric pressure, and the atmosphere temperature was raised at a temperature raising rate of 10° C./hr (0.166° C./min) for 10 hours as a temperature profile in the gradually heating region $P_0$. Next, the atmosphere temperature was maintained at the temperature $T_1$ of 1850° C. for 5 hours as a temperature profile in the first temperature maintaining region $P_1$, and the atmosphere temperature was maintained at the temperature $T_2$ of 1600° C. for 1.5 hours as a temperature profile in the second temperature maintaining region $P_2$. Then, the atmosphere temperature was lowered at a cooling rate of 600° C./hr as a temperature profile in the cooing region $P_3$. An extra portion was cut off from the resultant silicon nitride sintered substrate to provide a silicon nitride sintered substrate 101, which has square shape having a side of a length shown in Table 1. The thickness of the silicon nitride sintered substrate 101 was 0.32 mm.

Reference Examples 51 and 52

Square silicon nitride sintered substrates respectively having sides of lengths of 110 mm and 100 mm were produced. The other conditions than those shown in Table 1 were the same as those in the examples.

Comparative Examples 53 to 58

Silicon nitride sintered substrates were produced under the same conditions as those in the examples except that the maintaining temperature in the decarbonization region Pc, the atmosphere in the decarbonization step, and the thickness of the boron nitride powder layer were different as shown in Table 1.

2. Measurement of the Characteristics

The compositions of the silicon nitride sintered substrates in the examples, the reference examples and the comparative examples produced under the conditions described in the above embodiment were checked. Specifically, the silicon nitride sintered substrates were subjected to a microwave decomposition process to be put into a solution state, and then an Mg amount and an RE amount were measured by ICP spectrometry. The measured values were respectively converted into a magnesium oxide (MgO) content and a rare earth element oxide ($RE_2O_3$) content. The resultant contents were confirmed to be substantially the same (same in the % by mass until the first decimal place) as the amounts thereof initially contained (amounts in the composition).

Figure 12:
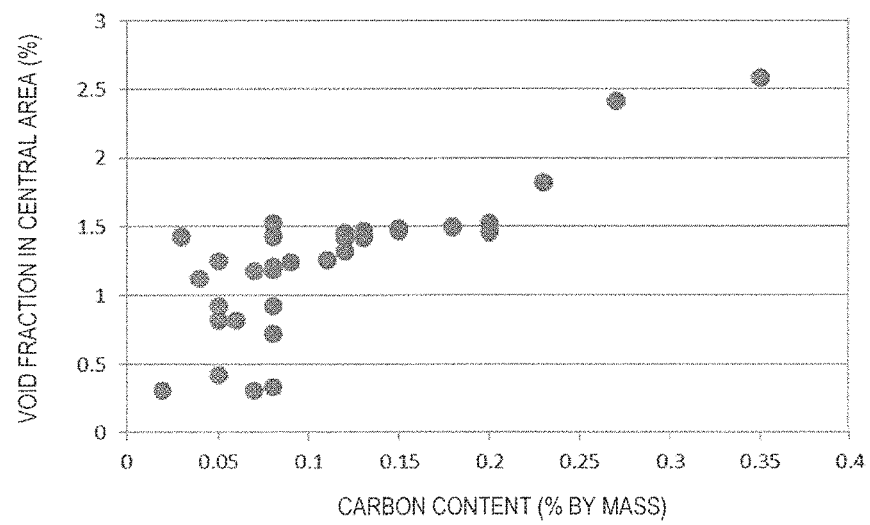
FIG. 12 is a graph showing the relationship between the void fraction and the carbon content in silicon nitride sintered substrates in examples 1 through 28, reference examples 51 and 52 and comparative examples 53 through 55.
Figure 13:
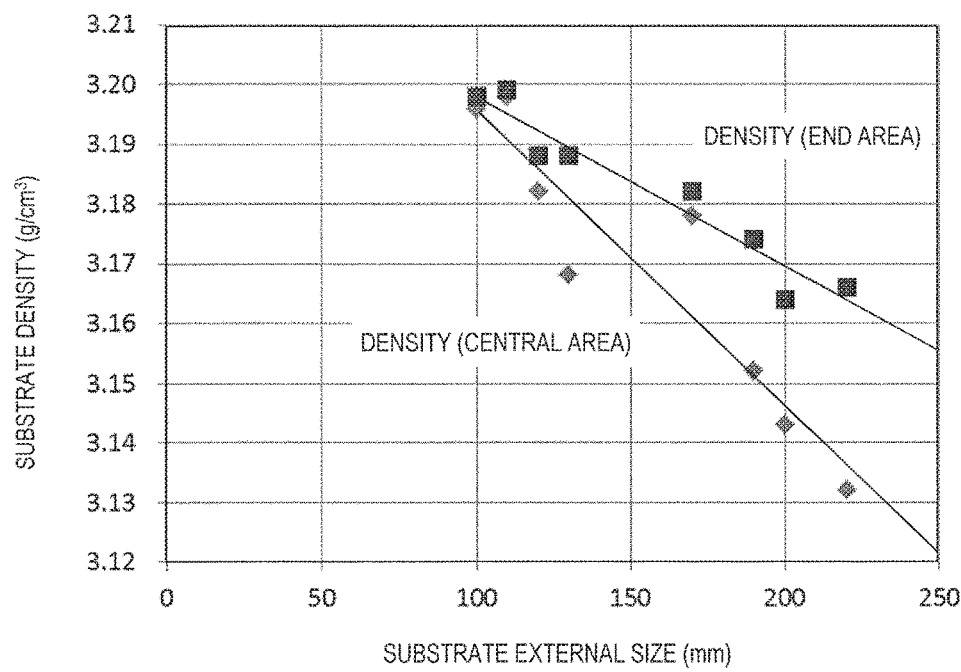
FIG. 13(a) and FIG. 13(b) are graphs respectively showing the relationships of the length of one side with respect to the density and the void fraction of each of the silicon nitride sintered substrates in examples 1, 3, 5, 10, 12 and 14 and reference examples 51 and 52.
Figure 13:
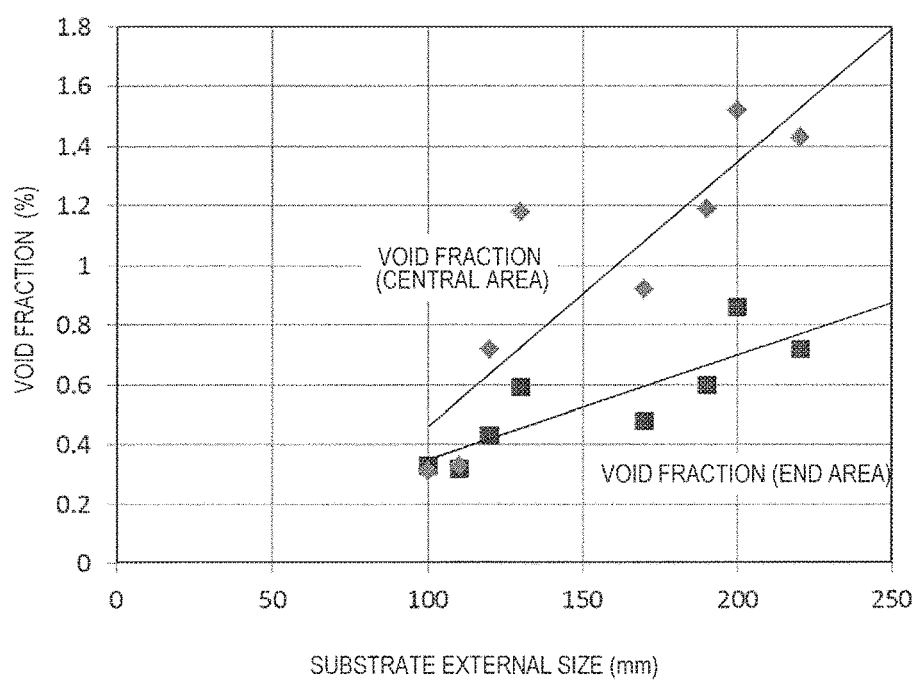
Figure 14:
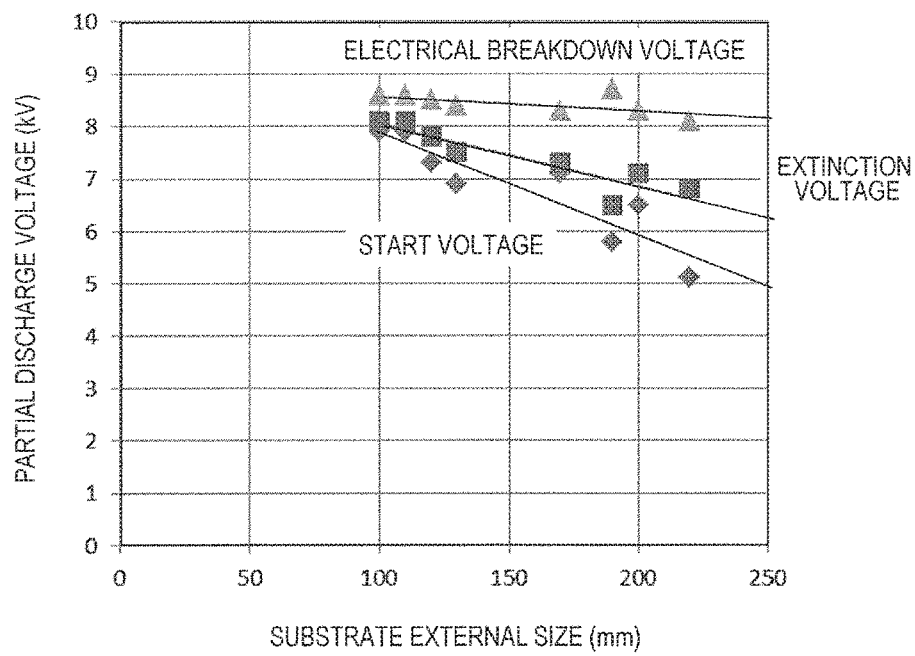
FIG. 14(a) and FIG. 14(b) are graphs respectively showing the relationships of the length of one side with respect to the partial discharge voltage and the Weibull coefficient of dielectric breakdown voltage of each of the silicon nitride sintered substrates in examples 1, 3, 5, 10, 12 and 14 and reference examples 51 and 52.
Figure 14:
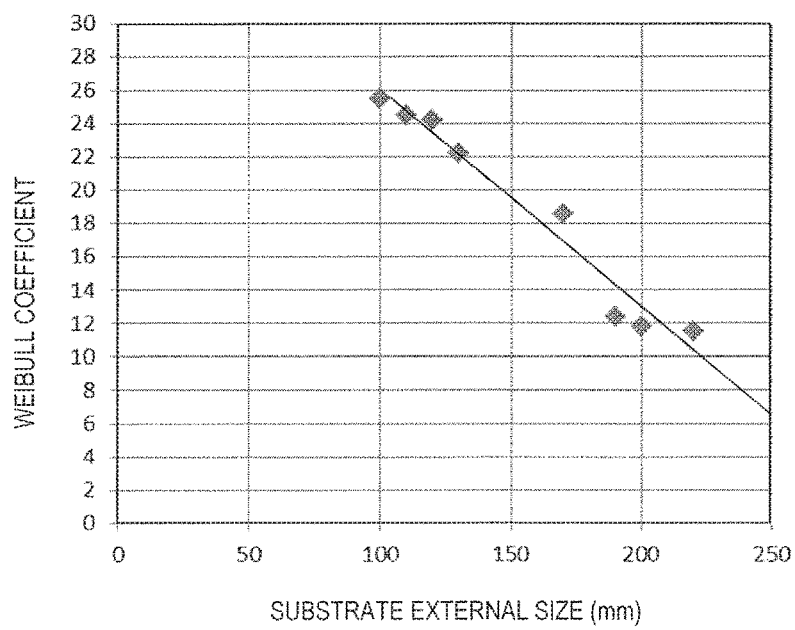

Regarding the produced silicon nitride sintered substrates, the density, the density ratio, the void fraction, the void fraction ratio, the carbon content, the partial discharge inception voltage, and the partial discharge extinction voltage were measured. The dielectric breakdown voltage was measured, and the Weibull coefficient of dielectric breakdown voltage was found. The results are shown in Table 1. In a graph shown in FIG. 12 regarding the silicon nitride sintered substrates in examples 1 through 28, reference examples 51 and 52, and comparative examples 53 through 55, the horizontal axis represents the carbon content and the vertical axis represents the void fraction (in the central area). Regarding the silicon nitride sintered substrates in examples 1, 3, 5, 10, 12 and 14 and reference examples 51 and 52, graphs were created that show the external size of the substrate represented by the horizontal axis and the above-described measurement results represented by the vertical axis. The graphs are shown in FIG. 13(*a*), FIG. 13(*b*), FIG. 14(*a*) and FIG. 14(*b*).

TABLE 1

| SAMPLE NO. | | MAINTAINING TEMPERATURE DECARBONIZATION STEP (° C.) | ATMOSPHERE IN DECARBONIZATION STEP | THICKNESS OF BORON NITRIDE POWDER LAYER (μm) | CARBON CONTENT (REMAINING AMOUNT) (% BY MASS) |
|---|---|---|---|---|---|
| EXAMPLE | 1 | 1000 | VACUUM | 3.1 | 0.03 |
| | 2 | 1100 | VACUUM | 3.5 | 0.05 |
| | 3 | 1000 | VACUUM | 4.2 | 0.07 |
| | 4 | 1200 | VACUUM | 4.4 | 0.03 |
| | 5 | 1000 | VACUUM | 4.4 | 0.00 |
| | 6 | 1150 | VACUUM | 4.3 | 0.04 |
| | 7 | 1300 | VACUUM | 3.5 | 0.02 |
| | 8 | 1100 | VACUUM | 4.5 | 0.05 |
| | 9 | 1050 | VACUUM | 4.8 | 0.08 |
| | 10 | 1000 | VACUUM | 4.6 | 0.08 |
| | 11 | 1100 | VACUUM | 4.6 | 0.05 |
| | 12 | 1000 | VACUUM | 4.9 | 0.08 |
| | 13 | 1050 | VACUUM | 4.5 | 0.05 |
| | 14 | 1000 | VACUUM | 4.7 | 0.08 |
| | 15 | 950 | VACUUM | 4.9 | 0.12 |
| | 16 | 925 | VACUUM | 4.6 | 0.15 |
| | 17 | 920 | VACUUM | 4.8 | 0.18 |

TABLE 1-continued

|  | | | | | |
|---|---|---|---|---|---|
|  | 18 | 900 | VACUUM | 4.6 | 0.20 |
|  | 19 | 950 | VACUUM | 4.3 | 0.12 |
|  | 20 | 925 | VACUUM | 4.0 | 0.15 |
|  | 21 | 920 | VACUUM | 4.8 | 0.18 |
|  | 22 | 900 | VACUUM | 4.6 | 0.20 |
|  | 23 | 1000 | VACUUM | 5.6 | 0.08 |
|  | 24 | 1000 | VACUUM | 6.5 | 0.09 |
|  | 25 | 1000 | VACUUM | 10.2 | 0.11 |
|  | 26 | 1000 | VACUUM | 12.5 | 0.12 |
|  | 27 | 1000 | VACUUM | 15.2 | 0.13 |
|  | 28 | 1000 | VACUUM | 18.5 | 0.13 |
| REF. EX. | 51 | 1000 | VACUUM | 4.5 | 0.08 |
|  | 52 | 1000 | VACUUM | 4.6 | 0.07 |
| COMPARATIVE EX. | 53 | 1000 | N2 | 4.5 | 0.23 |
|  | 54 | 880 | VACUUM | 4.5 | 0.27 |
|  | 55 | 600 | VACUUM | 4.8 | 0.35 |
|  | 56 | 1325 | VACUUM | 4.6 | 0.08 |
|  | 57 | 1000 | VACUUM | 22.2 | 0.15 |
|  | 58 | 1000 | VACUUM | 30.5 | 0.18 |

| | SAMPLE NO. | SUBSTRATE EXTERNAL SIZE (LENGTH OF ONE SIDE) (mm) | DENSITY CENTRAL ($g/cm^3$) | DENSITY END ($g/cm^3$) | DENSITY RATIO (CENTRAL/END) | VOID FRACTION CENTRAL (%) | VOID FRACTION END (%) |
|---|---|---|---|---|---|---|---|
| EXAMPLE | 1 | 120 | 3.162 | 3.168 | 1.00 | 0.72 | 0.43 |
|  | 2 | 120 | 3.165 | 3.176 | 1.00 | 1.25 | 0.83 |
|  | 3 | 130 | 3.168 | 3.188 | 0.99 | 1.16 | 0.59 |
|  | 4 | 150 | 3.162 | 3.174 | 1.00 | 1.43 | 0.78 |
|  | 5 | 170 | 3.178 | 3.182 | 1.00 | 0.92 | 0.48 |
|  | 6 | 170 | 3.160 | 3.172 | 1.00 | 1.12 | 0.73 |
|  | 7 | 190 | 3.192 | 3.195 | 1.00 | 0.31 | 0.28 |
|  | 8 | 190 | 3.185 | 3.188 | 1.00 | 0.42 | 0.32 |
|  | 9 | 190 | 3.175 | 3.102 | 1.00 | 0.82 | 0.42 |
|  | 10 | 190 | 3.152 | 3.174 | 0.99 | 1.19 | 0.60 |
|  | 11 | 200 | 3.172 | 3.177 | 1.00 | 0.82 | 0.76 |
|  | 12 | 200 | 3.143 | 3.164 | 0.99 | 1.52 | 0.86 |
|  | 13 | 220 | 3.173 | 3.185 | 1.00 | 0.92 | 0.52 |
|  | 14 | 220 | 3.132 | 3.166 | 0.99 | 1.43 | 0.72 |
|  | 15 | 220 | 3.130 | 3.168 | 0.99 | 1.45 | 0.73 |
|  | 16 | 220 | 3.128 | 3.164 | 0.99 | 1.48 | 0.74 |
|  | 17 | 220 | 3.126 | 3.163 | 0.99 | 1.49 | 0.75 |
|  | 18 | 220 | 3.124 | 3.161 | 0.99 | 1.52 | 0.78 |
|  | 19 | 190 | 3.131 | 3.167 | 0.99 | 1.42 | 0.71 |
|  | 20 | 190 | 3.127 | 3.163 | 0.99 | 1.47 | 0.75 |
|  | 21 | 190 | 3.126 | 3.162 | 0.99 | 1.50 | 0.76 |
|  | 22 | 190 | 3.127 | 3.162 | 0.99 | 1.46 | 0.76 |
|  | 23 | 190 | 3.148 | 3.171 | 0.99 | 1.21 | 0.52 |
|  | 24 | 190 | 3.145 | 3.168 | 0.99 | 1.24 | 0.65 |
|  | 25 | 190 | 3.143 | 3.166 | 0.99 | 1.26 | 0.72 |
|  | 26 | 190 | 3.137 | 3.165 | 0.99 | 1.32 | 0.73 |
|  | 27 | 190 | 3.131 | 3.164 | 0.99 | 1.42 | 0.75 |
|  | 28 | 190 | 3.123 | 3.162 | 0.88 | 1.47 | 0.76 |
| REF. EX. | 51 | 110 | 3.198 | 3.199 | 1.00 | 0.33 | 0.32 |
|  | 52 | 100 | 3.196 | 3.189 | 1.00 | 0.31 | 0.33 |
| COMPARATIVE EX. | 53 | 150 | 3.125 | 3.150 | 0.98 | 1.82 | 0.88 |
|  | 54 | 190 | 3.092 | 3.161 | 0.98 | 2.41 | 0.93 |
|  | 55 | 190 | 2.992 | 3.121 | 0.96 | 2.58 | 1.81 |
|  | 56 | 190 | 3.100 | 3.134 | 0.99 | 2.34 | 1.45 |
|  | 57 | 190 | 3.118 | 3.167 | 0.98 | 2.33 | 0.72 |
|  | 58 | 190 | 3.112 | 3.152 | 0.99 | 2.35 | 0.92 |

| | SAMPLE NO. | VOID FRACTION VOID FRACTION RATIO (END/CENTRAL) | PARTIAL DISCHARGE INCEPTION VOLTAGE (kV) | PARTIAL DISCHARGE EXTINCTION VOLTAGE (kV) | BREAKDOWN VOLTAGE (CIRCUIT BOARD) DIELECTRIC BREAKDOWN VOLTAGE (kV) | WEISULL COEFFICIENT |
|---|---|---|---|---|---|---|
| EXAMPLE | 1 | 0.60 | 7.9 | 7.8 | 8.5 | 24.2 |
|  | 2 | 0.66 | 6.8 | 7.2 | 8.2 | 18.3 |
|  | 3 | 0.50 | 6.9 | 7.5 | 8.4 | 22.2 |
|  | 4 | 0.55 | 6.7 | 6.9 | 8.4 | 11.2 |
|  | 5 | 0.52 | 7.1 | 7.3 | 8.3 | 18.0 |
|  | 6 | 0.65 | 6.3 | 6.5 | 8.6 | 15.2 |

TABLE 1-continued

|  | | | | | |
|---|---|---|---|---|---|
| | 7 | 0.90 | 7.5 | 7.8 | 8.7 | 22.3 |
| | 8 | 0.76 | 7.3 | 7.5 | 8.6 | 18.7 |
| | 9 | 0.51 | 7.1 | 7.6 | 8.3 | 16.5 |
| | 10 | 0.50 | 5.8 | 6.5 | 8.7 | 12.4 |
| | 11 | 0.93 | 7.2 | 7.5 | 8.2 | 16.7 |
| | 12 | 0.57 | 6.5 | 7.1 | 8.3 | 11.8 |
| | 13 | 0.57 | 7.1 | 7.5 | 8.1 | 12.1 |
| | 14 | 0.50 | 5.1 | 6.8 | 8.1 | 11.5 |
| | 15 | 0.50 | 4.9 | 6.7 | 8.2 | 14.3 |
| | 16 | 0.50 | 4.7 | 6.5 | 8.2 | 12.4 |
| | 17 | 0.50 | 4.5 | 6.3 | 8.2 | 12.1 |
| | 18 | 0.51 | 4.2 | 6.3 | 8.1 | 13.3 |
| | 19 | 0.50 | 4.4 | 6.4 | 8.3 | 13.2 |
| | 20 | 0.51 | 4.2 | 6.2 | 8.1 | 12.4 |
| | 21 | 0.51 | 4.2 | 6.1 | 8.1 | 14.2 |
| | 22 | 0.52 | 4.2 | 6.3 | 8.1 | 16.3 |
| | 23 | 0.51 | 5.4 | 7.1 | 8.7 | 12.1 |
| | 24 | 0.52 | 5.5 | 7.2 | 8.5 | 15.7 |
| | 25 | 0.57 | 5.2 | 7.1 | 8.4 | 16.2 |
| | 26 | 0.55 | 4.4 | 6.3 | 8.4 | 12.8 |
| | 27 | 0.53 | 4.2 | 6.3 | 8.3 | 11.1 |
| | 28 | 0.52 | 4.1 | 6.2 | 8.2 | 15.9 |
| REF. EX. | 51 | 0.97 | 7.9 | 6.1 | 8.6 | 24.5 |
| | 52 | 1.06 | 7.9 | 8.1 | 8.6 | 25.5 |
| COMPARATIVE EX. | 53 | 0.48 | 3.8 | 3.7 | 7.2 | 12.3 |
| | 54 | 0.39 | 3.2 | 2.9 | 6.9 | 8.9 |
| | 55 | 0.70 | 2.8 | 2.7 | 6.5 | 7.7 |
| | 56 | 0.62 | 3.1 | 3.0 | 6.6 | 7.9 |
| | 57 | 0.31 | 3.4 | 3.1 | 7.6 | 8.5 |
| | 58 | 0.39 | 3.3 | 3.2 | 7.5 | 9.2 |

3. Results and Discussion

In each of the silicon nitride sintered substrates in examples 1 through 28, the atmosphere in the decarbonization step is vacuum (80 Pa or lower) and the maintaining temperature is 900° C. to 1300° C. It is considered that under such conditions, the carbon content of the silicon nitride sintered substrate is 0.20% by mass or lower. It is also considered that since the carbon content is low and the thickness of the boron nitride powder layer is in the range of 3.1 μm to 18.5 μm, the density and the void fraction are low and the uniformity thereof at the main surface is high. Specifically, the ratio in the density between the central area and the end area is 0.98 or higher, the void fraction of the central area of the main surface is 1.80% or lower, and the void fraction of the end area of the main surface is 1.00% or lower. It is understood from FIG. 12 that when the carbon content is 0.2% by mass or lower, the void fraction of the central area is 1.52% or lower.

It is considered that since the void fraction is low, the partial discharge inception voltage and the partial discharge extinction voltage are each 4 kV or higher. It is considered that since the void fraction is low, the dielectric breakdown voltage is 8.0 V or higher and the Weibull coefficient of dielectric breakdown voltage is 10.0 or higher.

Especially in each of the silicon nitride sintered substrates in examples 1 through 13 and 23 through 25, the maintaining temperature in the decarbonization step is 1000° C. or higher, and the thickness of the applied boron nitride powder layer is about 10 μm or less. Therefore, the removal of carbon from the greensheets and the shrinkage of the greensheets in the stacked assemblies progress sufficiently, and as a result, the density of the silicon nitride sintered substrate is increased and the uniformity in the density is high. Specifically, the density dc of the central area of each silicon nitride sintered substrate is 3.140 g/cm$^3$ or higher, and the density de of the end area of each silicon nitride sintered substrate is 3.160 g/cm$^3$ or higher. It is considered that as a result of this, the partial discharge inception voltage is 5 kV or higher.

The silicon nitride sintered substrates in examples 1 through 28 each have a square shape having a side of a length of 120 mm or longer and 220 mm or shorter. It is understood that such a silicon nitride sintered substrates is large and has a high breakdown voltage and a high insulation reliability. The silicon nitride sintered substrates in reference examples 51 and 52 respectively have square shapes having sides of lengths of 100 mm and 110 mm. It is understood that the density, the void fraction, the partial discharge inception voltage, the dielectric breakdown voltage and the Weibull coefficient of dielectric breakdown voltage thereof are substantially the same as those in examples 1 through 28. From a comparison of these substrates, it is understood that the silicon nitride sintered substrates in examples 1 through 28, although being large, have a high in-plane uniformity in the partial discharge inception voltage and the dielectric breakdown voltage, like the silicon nitride sintered substrates having a side as short as 100 mm.

By contrast, in comparative example 53, the atmosphere in the decarbonization step is nitrogen. In comparative example 54 through 56, the atmosphere in the decarbonization step is vacuum, but the maintaining temperature is low. Therefore, carbon is not sufficiently removed in the decarbonization step, and the resultant silicon nitride sintered substrates contain a high carbon content. It is considered that as a result of these, the density and the void fraction are high, and the partial discharge voltage, the dielectric breakdown voltage and the Weibull coefficient of dielectric breakdown voltage are low.

In comparative example 56, it is considered that since the atmosphere temperature in the decarbonization step is too high, the sintering additive is evaporated. It is considered that because of this, the sintering is not performed at a high density, and thus the density and the void fraction are high and the partial discharge voltage, the dielectric breakdown voltage and the Weibull coefficient of dielectric breakdown voltage are low.

In comparative examples 57 and 58, it is considered that since the boron nitride powder layer is too thick, the shrinkage of the central area of the silicon nitride sintered substrate is inhibited. It is considered that as a result of this, the void fraction is especially high in the central area, and the partial discharge voltage, the dielectric breakdown voltage and the Weibull coefficient of dielectric breakdown voltage are low.

From the above-described results, it is understood that the silicon nitride sintered substrates in examples 1 through 28 are large and have a high breakdown voltage and a high insulation reliability because the maintaining temperature and the atmosphere in the decarbonization step fulfill the above-described conditions and the boron nitride powder layer has a thickness in the predetermined range.

FIG. 13(a) shows the relationship between the length of the side and the density of the silicon nitride sintered substrates in examples 1, 3, 5, 10, 12 and 14 and reference examples 51 and 52. FIG. 13(b) shows the relationship between the length of the side and the void fraction of the silicon nitride sintered substrates in examples 1, 3, 5, 10, 12 and 14 and reference examples 51 and 52. FIG. 13(a) also shows approximate straight lines found from the measurement data on the density of the central area and the density of the end area. FIG. 13(b) also shows approximate straight lines found from the measurement data on the void fraction of the central area and the void fraction of the end area. As can be seen from these results, although the length of the side of each of the silicon nitride sintered substrates in the examples is 220 mm at the maximum, it is presumed that even in a case of a silicon nitride sintered substrate of a square shape having a side of a length of 250 mm, the void fraction vc of the central area may be 1.80% or lower, the void fraction ve of the end area may be 1.00% or lower, the density dc of the central area may be 3.120 g/cm$^3$ or higher, and the density de of the end area may be 3.160 g/cm$^3$ or higher. It is understood that dc/de is 0.98 or higher and ve/vc is 0.50 or higher.

FIG. 14(a) shows the relationship between the length of the side and the partial discharge voltage of the silicon nitride sintered substrates in examples 1, 3, 5, 10, 12 and 14 and reference examples 51 and 52. FIG. 14(b) shows the relationship between the length of the side and the Weibull coefficient of dielectric breakdown voltage of the silicon nitride sintered substrates in examples 1, 3, 5, 10, 12 and 14 and reference examples 51 and 52. FIG. 14(a) also shows approximate straight lines found from the measurement data on the dielectric breakdown voltage, the partial discharge extinction voltage and the partial discharge inception voltage. FIG. 14(b) also shows an approximate straight line found from the measurement data on the Weibull coefficient of dielectric breakdown voltage. Also as can be seen from these results, it is presumed that in a case of a silicon nitride sintered substrate of a square shape having a side of a length of 250 mm, the dielectric breakdown voltage (dielectric withstand voltage) is 8 kV or higher, and the partial discharge extinction voltage and the partial discharge inception voltage are each 4 kV or higher. It is presumed that the Weibull coefficient of dielectric breakdown voltage is 6 or higher.

Therefore, even in the case where a silicon nitride sintered substrate of a square shape having a side of a length of 220 mm or longer and 250 mm or shorter is produced, it is presumed that the breakdown voltage and the insulation reliability are high and the in-plane uniformity thereof is also high.

INDUSTRIAL APPLICABILITY

A silicon nitride sintered substrate and a method for producing the same according to the present disclosure are preferably usable for an insulating substrate for any of various uses, especially, a high power circuit such as a power module, an LED or the like; namely, are preferably usable for an insulating substrate required to have a high dielectric breakdown voltage and a high insulation reliability.

REFERENCE SIGNS LIST 1, 1a, 1b greensheet
10 stacked assembly
11 plate
12 boron nitride powder layer
20 container
21 carrying plate
21a carrying plate
22 vertical frame member
24 packing powder
30 carrying plate assembly
40 inner container
40a, 50a bottom plate
40b, 50b side plate
40c, 50c top plate
101 silicon nitride sintered substrate
101' silicon nitride sintered body
101a main surface
102 end portion
110, 110' square
120 rectangular
130 tank
131 rear electrode
132 front electrode
133 insulating liquid
134 line
140 circular plate
141 electrode

The invention claimed is:

1. A silicon nitride sintered substrate having a main surface of a shape larger than a square having a side of a length of 120 mm, wherein a ratio dc/de is 0.98 or higher where a central area of the main surface has a density dc and an end area of the main surface has a density de, the central area of the main surface has a void fraction vc of 1.80% or lower, and the end area of the main surface has a void fraction ve of 1.00% or lower.

2. The silicon nitride sintered substrate of claim 1, wherein the density dc of the central area is 3.120 g/cm$^3$ or higher, the density de of the end area is 3.160 g/cm$^3$ or higher, and a ratio ve/vc of the void fraction vc of the central area and the void fraction ve of the end area is 0.50 or higher.

3. The silicon nitride sintered substrate of claim 1 wherein the density dc of the central area is 3.140 g/cm$^3$ or higher, the density de of the end area is 3.160 g/cm$^3$ or higher, and the void fraction vc of the central area is 1.3% or lower.

4. The silicon nitride sintered substrate of claim 1, wherein the silicon nitride sintered substrate has a partial discharge inception voltage, defined by a voltage value when a discharge charge amount of 10 pC is reached, of 4.0 kV or higher.

5. The silicon nitride sintered substrate of claim 1, wherein the silicon nitride sintered substrate has a partial discharge inception voltage, defined by a voltage value when a discharge charge amount of 10 pC is reached, of 5.0 kV or higher.

6. The silicon nitride sintered substrate of claim 1, wherein the silicon nitride sintered substrate has a carbon content of 0.20% by mass or lower.

7. The silicon nitride sintered substrate of claim 1, wherein the silicon nitride sintered substrate has a thickness of 0.15 mm or greater and 2.0 mm or less.

8. The silicon nitride sintered substrate of claim 1, wherein the main surface has a shape larger than a rectangle of 150 mm×170 mm.

9. The silicon nitride sintered substrate of claim 1, wherein the main surface has a square shape having a side of a length of 250 mm or a shape smaller than the square shape.

10. A plurality of silicon nitride sintered substrate piece divided from the silicon nitride sintered substrate of claim 1.

11. A circuit board including the silicon nitride sintered substrate of claim 1, the circuit board having a dielectric breakdown voltage of 8.0 kV or higher and a Weibull coefficient of dielectric breakdown voltage of 6 or higher.

12. The circuit board of claim 11, wherein the main surface has a square shape having a side of a length of 220 mm or a shape smaller than the square shape, and the circuit board has a Weibull coefficient of dielectric breakdown voltage of 10 or higher.

13. A method for producing a silicon nitride sintered substrate, comprising:
   step (a) of mixing $Si_3N_4$ powder at 80% by mass or higher and 98.3% by mass or lower, Mg compound powder at 0.7% by mass or higher and 10% by mass or lower as converted into an oxide, and at least one type of rare earth element compound powder at 1% by mass or higher and 10% by mass or lower as converted into an oxide to provide mixed powder;
   step (b) of putting the mixed powder into a slurry and forming a plurality of greensheets by molding;
   step (c) of stacking the plurality of greensheets with a boron nitride powder layer being located between each two adjacent greensheets, among the plurality of greensheets, to form a stacked assembly; and
   step (d) of locating the stacked assembly in a sintering furnace and sintering the stacked assembly;
   wherein:
   in the step (c), the boron nitride powder layer has a thickness of 3 μm or greater and 20 μm or less; and
   the step (d) includes:
      step (d1) of removing carbon from the greensheets while maintaining an atmosphere temperature of 900° C. or higher and 1300° C. or lower in a vacuum atmosphere of 80 Pa of lower; and
      step (d2) of, after the step (d1), sintering the greensheets at an atmosphere temperature of 1600° C. or higher and 2000° C. or lower in a nitrogen atmosphere.

14. A method for producing a silicon nitride sintered substrate, comprising:
   step (a) of mixing Si powder, or Si powder and $Si_3N_4$ powder, at 80% by mass or higher and 98.3% by mass or lower as converted into $Si_3N_4$, Mg compound powder at 0.7% by mass or higher and 10% by mass or lower as converted into an oxide, and at least one type of rare earth element compound powder at 1% by mass or higher and 10% by mass or lower as converted into an oxide to provide mixed powder;
   step (b) of putting the mixed powder into a slurry and forming a plurality of greensheets by molding;
   step (c) of stacking the plurality of greensheets with a boron nitride powder layer being located between each two adjacent greensheets, among the plurality of greensheets, to form a stacked assembly; and
   step (d) of locating the stacked assembly in a sintering furnace and sintering the stacked assembly;
   wherein:
   in the step (c), the boron nitride powder layer has a thickness of 3 μm or greater and 20 μm or less; and
   the step (d) includes:
      step (d1) of removing carbon from the greensheets while maintaining an atmosphere temperature of 900° C. or higher and 1300° C. or lower in a vacuum atmosphere of 80 Pa of lower;
      step (d2) of, after the step (d1), nitriding the Si powder in the greensheets at an atmosphere temperature of 1350° C. or higher and 1450° C. or lower in a nitrogen atmosphere; and
      step (d3) of, after the step (d2), sintering the greensheets at an atmosphere temperature of 1600° C. or higher and 2000° C. or lower in the nitrogen atmosphere.

15. The method for producing a silicon nitride sintered substrate of claim 13, wherein the silicon nitride sintered substrate has a main surface of a shape larger than a square having a side of a length of 120 mm.

16. The method for producing a silicon nitride sintered substrate of claim 13, wherein the main surface has a shape larger than a rectangle of 150 mm×170 mm.

17. The method for producing a silicon nitride sintered substrate of claim 13, wherein the main surface has a square shape having a side of a length of 250 mm or a shape smaller than the square shape.

18. The method for producing a silicon nitride sintered substrate of claim 14, wherein the silicon nitride sintered substrate has a main surface of a shape larger than a square having a side of a length of 120 mm.

19. The method for producing a silicon nitride sintered substrate of claim 14, wherein the main surface has a shape larger than a rectangle of 150 mm×170 mm.

20. The method for producing a silicon nitride sintered substrate of claim 14, wherein the main surface has a square shape having a side of a length of 250 mm or a shape smaller than the square shape.

* * * * *